United States Patent
Song et al.

(10) Patent No.: US 11,239,297 B2
(45) Date of Patent: Feb. 1, 2022

(54) ARRAY SUBSTRATE WITH CAPACITOR INCLUDING CONDUCTIVE PART OF ACTIVE LAYER AND METHOD OF FABRICATING THEREOF

(71) Applicant: BOE Technology Group Co., Ltd., Beijing (CN)

(72) Inventors: Zhen Song, Beijing (CN); Guoying Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 637 days.

(21) Appl. No.: 16/079,744

(22) PCT Filed: Jan. 25, 2018

(86) PCT No.: PCT/CN2018/074123
§ 371 (c)(1),
(2) Date: Aug. 24, 2018

(87) PCT Pub. No.: WO2019/041742
PCT Pub. Date: Mar. 7, 2019

(65) Prior Publication Data
US 2021/0193768 A1    Jun. 24, 2021

(30) Foreign Application Priority Data

Aug. 31, 2017 (CN) .......................... 201710778807.1

(51) Int. Cl.
*H01L 27/32* (2006.01)
(52) U.S. Cl.
CPC ...... *H01L 27/3265* (2013.01); *H01L 27/3248* (2013.01); *H01L 27/3258* (2013.01)
(58) Field of Classification Search
CPC ............. H01L 27/3265; H01L 27/3248; H01L 27/3258
See application file for complete search history.

(56) References Cited

U.S. PATENT DOCUMENTS

| 9,691,834 B2* | 6/2017 | Wang | H01L 27/3276 |
| 2003/0141811 A1* | 7/2003 | Park | H01L 27/1255 |
| | | | 313/506 |

(Continued)

FOREIGN PATENT DOCUMENTS

| CN | 104134674 A | 11/2014 |
| CN | 105408813 A | 3/2016 |

(Continued)

OTHER PUBLICATIONS

Second Office Action in the Chinese Patent Application No. 201710778807.1, dated Oct. 12, 2020; English translation attached.

(Continued)

*Primary Examiner* — Lex H Malsawma
(74) *Attorney, Agent, or Firm* — Intellectual Valley Law, P.C.

(57) ABSTRACT

The present application discloses an array substrate having a plurality of subpixel areas. The array substrate includes a base substrate; a plurality of first thin film transistors on the base substrate, each of which being in one of the plurality of subpixel areas; and a plurality of capacitor electrodes, each of which being in one of the plurality of subpixel areas. Each of the plurality of first thin film transistors includes a first active layer, a first gate electrode, a first source electrode, and a first drain electrode. The first active layer includes a first semi-conductive channel part, a first conductive part electrically connected to the first drain electrode, and a second conductive part electrically connected to the first source electrode. Each of the plurality of capacitor electrodes, the insulating layer, and the first conductive part constitute a first storage capacitor in one of the plurality of subpixel areas.

20 Claims, 16 Drawing Sheets

(56) References Cited

U.S. PATENT DOCUMENTS

| | | | |
|---|---|---|---|
| 2007/0103608 A1* | 5/2007 | Lee | G02F 1/13454 |
| | | | 349/38 |
| 2014/0048861 A1 | 2/2014 | Shibata et al. | |
| 2015/0053935 A1* | 2/2015 | Gupta | H01L 27/1251 |
| | | | 257/40 |
| 2015/0243722 A1* | 8/2015 | Kwon | H01L 27/3272 |
| | | | 257/40 |
| 2016/0020333 A1 | 1/2016 | Gao | |
| 2016/0071888 A1 | 3/2016 | Park et al. | |
| 2016/0087021 A1* | 3/2016 | Sato | H01L 27/3262 |
| | | | 257/43 |
| 2016/0163780 A1* | 6/2016 | Park | H01L 27/3248 |
| | | | 257/40 |
| 2018/0151114 A1* | 5/2018 | Choi | G09G 3/325 |

FOREIGN PATENT DOCUMENTS

| | | |
|---|---|---|
| CN | 106129097 A | 11/2016 |
| EP | 3029733 A1 | 6/2016 |
| JP | 2001051622 A | 2/2001 |
| TW | M535405 U | 1/2017 |
| WO | 2015031037 A1 | 3/2015 |

OTHER PUBLICATIONS

International Search Report & Written Opinion dated Jun. 6, 2018, regarding PCT/CN2018/074123.
First Office Action in the Japanese Patent Application No. 2018-562625, dated Jun. 22, 2021; English translation attached.
Extended European Search Report in the European Patent Application No. 18796571.0, dated Apr. 21, 2021.

* cited by examiner

ARRAY SUBSTRATE WITH CAPACITOR INCLUDING CONDUCTIVE PART OF ACTIVE LAYER AND METHOD OF FABRICATING THEREOF

CROSS-REFERENCE TO RELATED APPLICATION

This application is a national stage application under 35 U.S.C. § 371 of International Application No. PCT/CN2018/074123, filed Jan. 25, 2018, which claims priority to Chinese Patent Application No. 201710778807.1, filed Aug. 31, 2017, the contents of which are incorporated by reference in the entirety.

TECHNICAL FIELD

The present invention relates to display technology, more particularly, to an array substrate, a display apparatus, and a method of fabricating an array substrate.

BACKGROUND

Display apparatuses such as liquid crystal display (LCD) apparatuses, organic light-emitting diode display (OLED) apparatuses, and electrophoretic display (EPD) apparatuses have been widely used. Typically, the display apparatus includes an array substrate and a counter substrate assembled together. An array substrate typically includes a plurality of subpixel areas in its display area, each of the plurality of subpixel areas is controlled by a thin film transistor for image display.

SUMMARY

In one aspect, the present invention provides an array substrate having a plurality of subpixel areas, comprising a base substrate; a plurality of first thin film transistors on the base substrate, each of which being in one of the plurality of subpixel areas; and a plurality of capacitor electrodes, each of which being in one of the plurality of subpixel areas; wherein each of the plurality of first thin film transistors comprises a first active layer, a first gate electrode, a first source electrode, and a first drain electrode; and the first active layer comprises a first semi-conductive channel part, a first conductive part electrically connected to the first drain electrode, and a second conductive part electrically connected to the first source electrode; and wherein each of the plurality of capacitor electrodes is electrically connected to the first gate electrode of one of the plurality of thin film transistors and insulated from the first active layer by an insulating layer; and each of the plurality of capacitor electrodes, the insulating layer, and the first conductive part of one of the plurality of thin film transistors constitute a first storage capacitor in one of the plurality of subpixel areas.

Optionally, an orthographic projection of the first semi-conductive channel part on the base substrate at least partially overlaps with an orthographic projection of the first gate electrode on the base substrate; and an orthographic projection of one of the plurality of capacitor electrodes on the base substrate at least partially overlaps with an orthographic projection of the first conductive part of one of the plurality of thin film transistors on the base substrate.

Optionally, the orthographic projection of the one of the plurality of capacitor electrodes on the base substrate substantially overlaps with the orthographic projection of the first conductive part of one of the plurality of thin film transistors on the base substrate.

Optionally, the first conductive part has an area greater than an area of the second conductive part.

Optionally, the insulating is a gate insulating layer between the first active layer and the first gate electrode, and between the plurality of capacitor electrodes and the first conductive part.

Optionally, the gate insulating layer has a thickness in a range of approximately 1500 Å to approximately 2000 Å.

Optionally, the plurality of capacitor electrodes and the first gate electrode are ii same layer.

Optionally, each of the plurality of first thin film transistors is a top gate-type thin film transistor; the gate insulating layer is on a side of the first active layer distal to the base substrate; and the first gate electrode is on a side of the gate insulating layer distal to the first active layer.

Optionally, the array substrate further comprises an inter-layer dielectric layer on a side of the first gate electrode distal to the base substrate; and wherein the first source electrode and the first drain electrode are on a side of the inter-layer dielectric layer distal to the base substrate; and each of the plurality of capacitor electrodes, the first drain electrode, the inter-layer dielectric layer form a second storage capacitor; and the first storage capacitor and the second storage capacitor being connected in parallel with one another to collectively constitute a storage capacitor in one of the plurality of subpixel areas.

Optionally, the inter-layer dielectric layer has a thickness in a range of approximately 5000 Å to approximately 7000 Å.

Optionally, an orthographic projection of the first drain electrode on the base substrate at least partially overlaps with an orthographic projection of one of the plurality of capacitor electrodes on the base substrate, Optionally, the orthographic projection of the first drain electrode on the base substrate substantially overlaps with the orthographic projection of the orthographic projection of one of the plurality of capacitor electrodes on the base substrate.

Optionally, the array substrate thither comprises a plurality of second thin film. transistors, each of which being in one of the plurality of subpixel areas; and wherein each of the plurality of second thin film transistors comprises a second active layer, a second gate electrode, a second source electrode, and a second drain electrode; the second active layer comprises a second semi-conductive channel part, a third conductive part electrically connected to the second source electrode, and a fourth conductive part electrically connected to the second drain electrode; an orthographic projection of the second semi-conductive channel part on the base substrate at least partially overlaps with an orthographic projection of the second gate electrode on the base substrate; and one of the plurality of capacitor electrodes is electrically connected to the first gate electrode of one of the plurality of thin film transistors through the second drain electrode.

Optionally, the first active layer has an area greater than an area of the second active layer; and the first active layer and the second active layer are insulated from each other.

Optionally, the first active layer and the second active layer are in a same layer and spaced apart from each other.

Optionally, the first active layer and the second active layer are in a same layer; the first gate electrode, the second gate electrode, and the plurality of capacitor electrodes are in a same layer; and the first source electrode, the first drain electrode, the second source electrode, and the second drain electrode are in a same layer.

Optionally, the array substrate further comprises a plurality of organic light emitting diodes, each of which being in one of the plurality of subpixel areas; wherein each of the plurality of organic light emitting diodes comprises a first electrode, a second electrode, and an organic light emitting layer between the first electrode and the second electrode; and the first electrode is electrically connected to the first drain electrode.

Optionally, the array substrate further comprises a gate insulating layer between the first active layer and the first gate electrode, and between the plurality of capacitor electrodes and the first active layer; an inter-layer dielectric layer on a side of the first gate electrode distal to the base substrate; and a plurality of second thin film transistors, each of which being in one of the plurality of subpixel areas; wherein the gate insulating layer is on a side of the first active layer distal to the base substrate; the first gate electrode is on a side of the gate insulating layer distal to the first active layer; and the first source electrode and the first drain electrode are on a side of the inter-layer dielectric layer distal to the base substrate; each of the plurality of second thin film transistors comprises a second active layer, a second gate electrode, a second source electrode, and a second drain electrode; the second active layer comprises a second semi-conductive channel part, a third conductive part electrically connected to the second source electrode, and a fourth conductive part electrically connected to the second drain electrode; and one of the plurality of capacitor electrodes is electrically connected to the first gate electrode through the second drain electrode.

In one aspect, the present invention provides a display apparatus comprising the array substrate described herein or fabricated by a method described herein.

In one aspect, the present invention provides a method of fabricating an array substrate having a plurality of subpixel areas, comprising forming a plurality of first thin film transistors on a base substrate, each of which being formed in one of the plurality of subpixel areas; and forming a plurality of capacitor electrodes, each of which being formed in one of the plurality of subpixel areas; wherein forming each of the plurality of first thin film transistors comprises forming a first active layer, forming a first gate electrode, forming a first source electrode, and forming a first drain electrode; forming the first active layer comprises forming a first semi-conductive channel part, forming a first conductive part electrically connected to the first drain electrode, and forming a second conductive part electrically connected to the first source electrode; and the first semi-conductive channel part and the first gate electrode are formed so that an orthographic projection of the first semi-conductive channel part on the base substrate at least partially overlaps with an orthographic projection of the first gate electrode on the base substrate; and wherein each of the plurality of capacitor electrodes is formed to be electrically connected to the first gate electrode of one of the plurality of thin film transistors and insulated from the first active layer by an insulating layer; wherein the plurality of capacitor electrodes and the plurality of first thin film transistors are formed so that an orthographic projection of one of the plurality of capacitor electrodes on the base substrate at least partially overlaps with an orthographic projection of the first conductive part of one of the plurality of thin film transistors on the base substrate; and each of the plurality of capacitor electrodes, the insulating layer, and the first conductive part of one of the plurality of thin film transistors constitute a first storage capacitor in one of the plurality of subpixel areas.

Optionally, forming the first active layer comprises for a first semi-conductive material layer on the base substrate; and applying a conductive treatment on a first part and a second part of the first semi-conductive material layer thereby forming the first conductive part and the second conductive part; wherein a third part of the first semi-conductive material layer between the first part and the second part of the second semi-conductive material layer is substantially untreated by the conductive treatment thereby forming the first channel part.

Optionally, the conductive treatment is performed using a plasma.

Optionally, the method further comprises forming a plurality of second thin film transistors, each of which being in one of the plurality of subpixel areas; wherein forming each of the plurality of second thin film transistors comprises forming a second active layer, forming a second gate electrode, forming a second source electrode, and forming a second drain electrode; forming the second active layer comprises forming a second semi-conductive channel part, forming a third conductive part electrically connected to the second source electrode, and forming a fourth conductive part electrically connected to the second drain electrode; one of the plurality of capacitor electrodes is formed to be electrically connected to the first gate electrode through the second drain electrode.

Optionally, forming the second active layer comprises forming a second semi-conductive material layer on the base substrate; and applying a conductive treatment on a first part and a second part of the second semi-conductive material layer thereby forming the third conductive part and the fourth conductive part; wherein a third part of the second semi-conductive material layer between the first part and the second part of the second semi-conductive material layer is substantially untreated by the conductive treatment thereby forming the second channel part.

Optionally, the conductive treatment is performed using a plasma.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It intended to be exhaustive or to be limited to the precise form disclosed.

In conventional display apparatuses such as organic light emitting diode display apparatuses, aperture ratio is limited by components such as thin film transistors and various sig al lines. Moreover, the aperture ratio of a display apparatus is further affected by the storage capacitor, which occupies a relatively large area in the array substrate of the display apparatus.

Accordingly, the present disclosure provides, inter alia, an array substrate, a display apparatus, and a method of fabricating an array substrate that substantially obviate one or more of the problems due to limitations and disadvantages of the related art. In one aspect, the present disclosure provides an array substrate having a plurality of subpixel areas. In some embodiments, the array substrate includes a base substrate; a plurality of first thin film transistors on the base substrate, each of which being in one of the plurality of subpixel areas; and a plurality of capacitor electrodes, each of which being in one of the plurality of subpixel areas. Optionally, each of the plurality of first thin film transistors includes a first active layer, a first gate electrode, a first source electrode, and a first drain electrode; the first active layer includes a first semi-conductive channel part, a first conductive part electrically connected to the first drain electrode, and a second conductive part electrically connected to the first source electrode. Optionally, each of the plurality of capacitor electrodes is electrically connected to the first gate electrode of one of the plurality of thin film transistors and insulated from the first active layer of one of the plurality of thin film transistors by an insulating layer. Optionally, each of the plurality of capacitor electrodes, the insulating layer, and the first conductive part of one of the plurality of thin film transistors constitute a first storage capacitor in one of the plurality of subpixel areas.

Figure 1A:
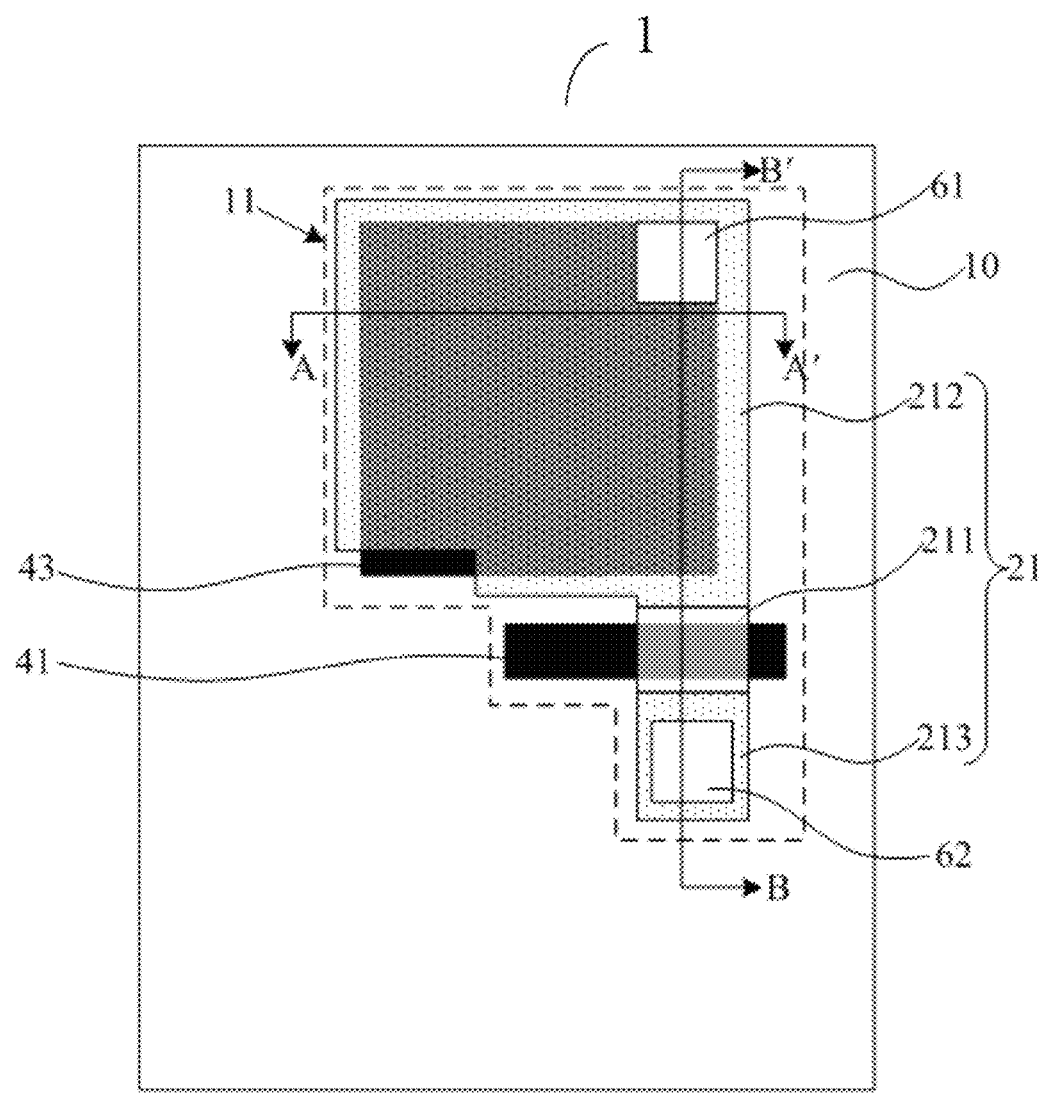
FIG. 1A is a schematic diagram illustrating the structure of a subpixel area in an array substrate in some embodiments according to the present disclosure.
Figure 1B:
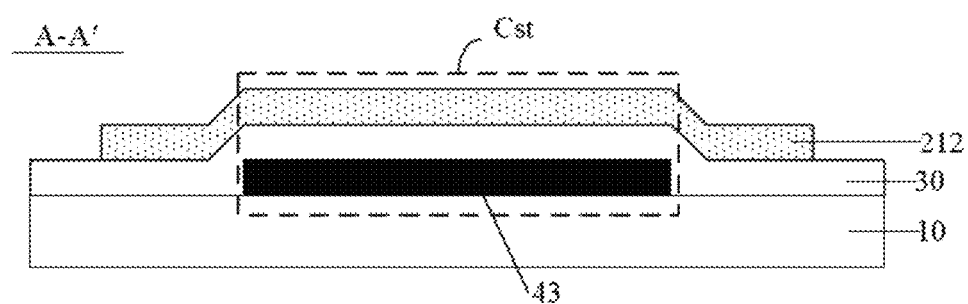
FIG. 1B is a cross-sectional view along A-A' line of the array substrate in FIG. 1A.
Figure 1C:
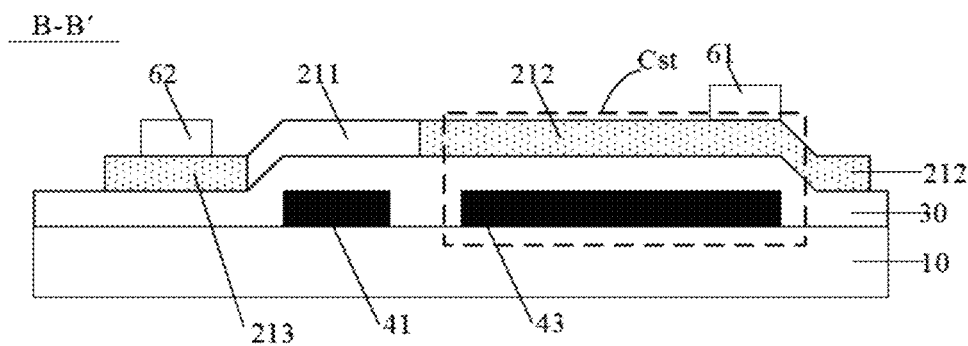
FIG. 1C is a cross-sectional view along B-B' line of the array substrate in FIG. 1A.

FIG. 1A is a schematic diagram illustrating the structure of one of the plurality of subpixel areas in an array substrate in some embodiments according to the present disclosure. FIG. 1B is a cross-sectional view along A-A" line of the array substrate in FIG. 1A. FIG. 1C is a cross-sectional view along B-B' line of the array substrate in FIG. 1A. Referring to FIGS. 1A to 1C, the array substrate in some embodiments includes a base substrate 10 and a plurality of first thin film transistors 11 on the base substrate 10. Each of the plurality of first thin film transistors 11 is in one of the plurality of subpixel areas 1. As shown in FIG. 1A, each of the plurality of first thin film transistors 11 includes a first active layer 21, a first gate electrode 41, a first source electrode 62, and a first drain electrode 61. The first active layer 21 includes a first semi-conductive channel part 211, a first conductive part 212 electrically connected to the first drain electrode 61, and a second conductive part 213 electrically connected to the first source electrode 62. Optionally, the first semi-conductive channel part 211 is between the first conductive part 212 and the second conductive part 213. Optionally, an orthographic projection of the first semi-conductive channel part 212 on the base substrate 10 at least partially overlaps with an orthographic projection of the first gate electrode 41 on the base substrate 10.

In some embodiments, the first semi-conductive channel part 211 includes a semi-conductive material, and each of the first conductive part 212 and the second conductive part 213 includes a conductive material, the conductive material of the first conductive part 212 and the second conductive part 213 includes at least one element in common with the semi-conductive material of the first semi-conductive channel part 211. Optionally, the conductive material of the first conductive part 212 and the second conductive part 213 is converted from the semi-conductive material of the first semi-conductive channel part 211 by a plasma treatment. Optionally, the first semi-conductive channel part 211 includes a metal oxide semi-conductive material, and each of the first conductive part 212 and the second conductive part 213 includes a reductive plasma-treated metal oxide semi-conductive material. For example, the first semi-conductive channel part 211 includes a metal oxide semi-conductive material, and each of the first conductive part 212 and the second conductive part 213 includes a partially metalized metal oxide semi-conductive material formed by a conductive treatment performed by reducing the oxygen content of the first conductive part 212 and the second conductive part 213. Optionally, the metal oxide semi-conductive material includes indium gallium zinc oxide. Optionally, each of the first conductive part 212 and the second conductive part 213 includes a plasma-treated indium gallium zinc oxide (e.g., treated by a hydrogen plasma, a helium plasma, a nitrogen plasma, an argon plasma, a $NH_3$ plasma, or a combination thereof). Optionally, each of the first conductive part 212 and the second conductive part 213 includes a metal, and the first semi-conductive channel part 211 includes an oxidative plasma-treated metal material.

Optionally, the first conductive part 212 is a drain electrode contact part of the first active layer 21, and the second conductive part 213 is a source electrode contact part of the first active layer 21. The first drain electrode 61 is electrically connected to (e.g., in contact with) the first conductive part 212, the first drain electrode 61 and the first conductive part 212 have a substantially the same voltage level. The first source electrode 62 is electrically connected to (e.g., in contact with) the second conductive part 213, the first source electrode 62 and the second conductive part 213 have a substantially the same voltage level.

The array substrate further includes a plurality of storage capacitors Cst, each of which configured to store a driving voltage supplied via a data line and generate a predetermined driving current. Each of the plurality of storage capacitors Cst is in one of the plurality of subpixel areas 1.

As shown in FIGS. 1A to 1C, each of the plurality of storage capacitors Cst includes a capacitor electrode 43 electrically connected to the first gate electrode 41. The capacitor electrode 43 is electrically insulated from the first active layer 21 (e.g., by a gate insulating layer 30). Each of the plurality of storage capacitors Cst includes a first storage capacitor formed between the capacitor electrode 43 and the first conductive part 212. Optionally, an orthographic projection of the capacitor electrode 43 on the base substrate 10 at least partially overlaps with an orthographic projection of the first conductive part 212 on the base substrate 10. Optionally, the orthographic projection of the capacitor electrode 43 on the base substrate 10 substantially overlaps with the orthographic projection of the first conductive part 212 on the base substrate 10. As used herein, the term the term "substantially overlap" means that two orthographic projections are at least 80%, at least 85%, at least 90%, at least 95%, at least 96%, at least 97%, at least 98%, at least 99%, at least 99.5%, or at least 99.9% overlapping.

Optionally, the plurality of first thin film transistors 11 are a plurality of bottom gate-type thin film transistors. Optionally, the plurality of first thin film transistors 11 are a plurality of top gate-type thin film transistors.

The capacitor electrode 43 may be electrically connected to the first gate electrode 41 in any appropriate manner. Optionally, the capacitor electrode 43 and the first gate electrode 41 are directly connected, e.g., the capacitor electrode 43 and the first gate electrode 41 constitute an integral electrode. Optionally, capacitor electrode 43 and the first gate electrode 41 are electrically connected through another component, e.g., another electrode or a signal In some embodiments, the first conductive part 212 has an area greater than an area of the second conductive part 213. For example, an orthographic projection of the first conductive part 212 on the base substrate 10 has an area greater than an area of an orthographic projection of the second conductive part 213 on the base substrate 10. As shown in FIG. 1A and FIG. 1C, the orthographic projection of the capacitor electrode 43 on the base substrate It) is substantially non-overlapping with an orthographic projection of the second conductive part 213 on the base substrate 10. Optionally, the orthographic projection of the capacitor electrode 43 on the base substrate 10 is substantially non-overlapping with an orthographic projection of the first semi-conductive channel part 211 on the base substrate 10.

In the present array substrate, a first conductive part 212 and a second conductive part 213 are formed in each of the plurality of first thin film transistors 11 in each of the plurality of subpixel areas 1, a capacitor electrode 43 is then formed to constitute a storage capacitor with the first conductive part 212. In the present array substrate, the first conductive part 212 may be designed to have an increased area so that orthographic projections of the capacitor electrode 43 and the first conductive part 212 on the base substrate 10 overlap as much as possible, to achieve a large storage capacitance. Based on this design, to achieve a certain storage capacitance, an area occupied by the plurality of storage capacitors Cst can be minimized to the extent possible, effectively enhancing the aperture ratio of the array substrate. Moreover, the adverse effects of thin film transistor parasitic capacitance during data signal input can be avoided in the present array substrate.

In some embodiments, the array substrate further includes a gate insulating layer 30 between the first active layer 21 and the first gate electrode 41, and between the capacitor electrode 43 and the first conductive part 212. Optionally, the gate insulating layer 30 has a thickness in a range of approximately 1500 Å to approximately 2000 Å. By having the gate insulating layer 30 relatively thin, the storage capacitance formed between the capacitor electrode 43 and the first conductive part 212 can be further enhanced, particularly when the gate insulating layer 30 is the only layer spacing apart the capacitor electrode 43 and the first conductive part 212.

In some embodiments, the capacitor electrode 43 and the first gate electrode 41 are in a same layer. As used herein, the term "same layer" refers to the relationship between the layers simultaneously formed in the same step. In one example, the capacitor electrode 43 and the first gate electrode 41 are in a same layer when they are formed as a result of one or more steps of a same patterning process performed in a same layer of material. In another example, the capacitor electrode 43 and the first gate electrode 41 can be formed in a same layer by simultaneously performing the step of forming the capacitor electrode 43 and the step of forming the first gate electrode 41. The term "same layer" does not always mean that the thickness of the layer or the height of the layer in a cross-sectional view is the same. Optionally, each of the plurality of first thin film transistors 11 is a top gate-type thin film transistor, the gate insulating layer 30 is on a side of the first active layer 21 distal to the base substrate 10, and the first gate electrode 41 is on a side of the gate insulating layer 30 distal to the first active layer 21.

Figure 2A:
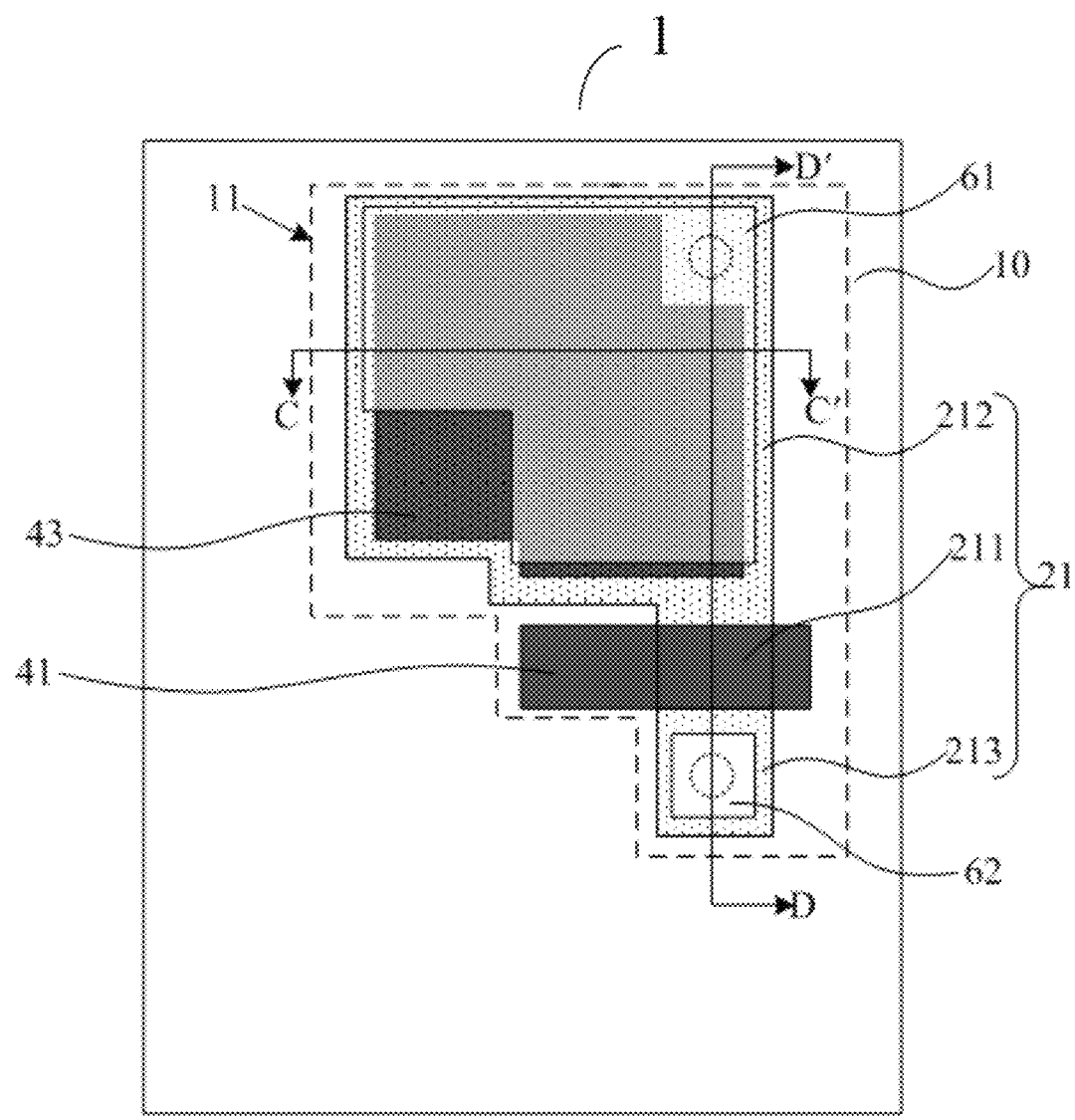
FIG. 2A is a schematic diagram illustrating the stricture of a subpixel area in an array substrate in some embodiments according to the present disclosure.
Figure 2B:
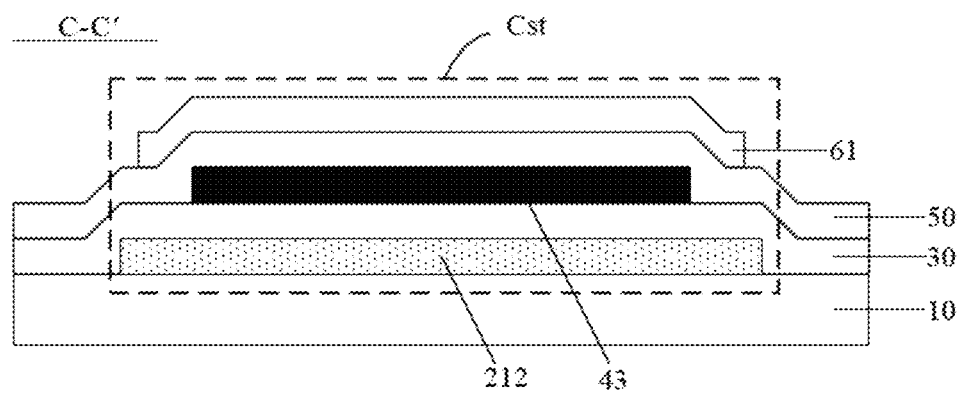
FIG. 2B is a cross-sectional view along C-C' line of the array substrate in FIG. 2A.
Figure 2C:
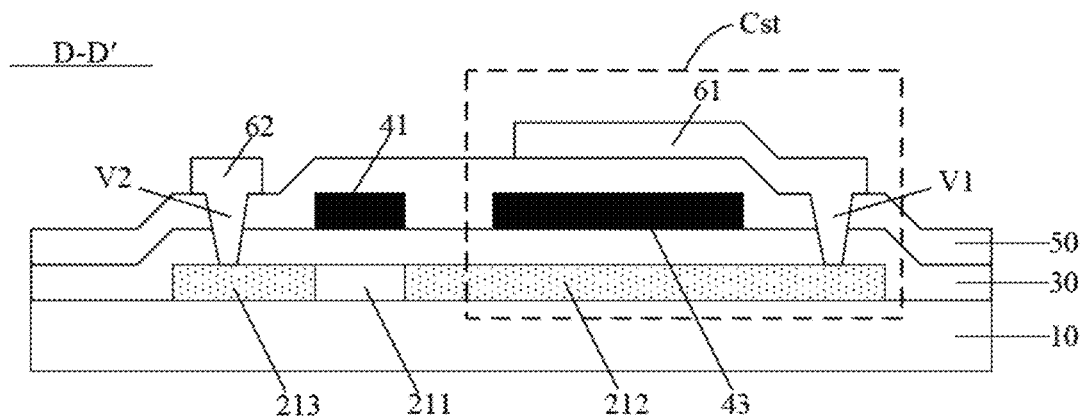
FIG. 2C is a cross-sectional view along D-D' line of the array substrate in FIG. 2A.

FIG. 2A is a schematic diagram illustrating the structure of a subpixel area in an array substrate in some embodiments according to the present disclosure. FIG. 2B is a cross-sectional view along C'-C" line of the array substrate in FIG. 2A. FIG. 2C is a cross-sectional view along D-D' line of the array substrate in FIG. 2A. Referring to FIGS. 2A to 2C, the array substrate in some embodiments further includes an inter-layer dielectric layer 50 on a side of the first gate electrode 41 distal to the base substrate 10. Optionally, each of the plurality of first thin film transistors 11 is a top gate-type thin film transistor, the gate insulating layer 30 is on a side of the first active layer 21 distal to the base substrate 10, the first gate electrode 41 is on a side of the gate insulating layer 30 distal to the first active layer 21, the inter-layer dielectric layer 50 is on a side of the first gate electrode 41 distal to the base substrate 10, and the first source electrode 62 and the first drain electrode 61 are on a side of the inter-layer dielectric layer 50 distal to the base substrate 10. The first drain electrode 61 is electrically connected to the first conductive part 212 through a first via V1 extending through the inter-layer dielectric layer 50 and the gate insulating layer 30. The first source electrode 62 is electrically connected to the second conductive part 213 through a second via V2 extending through the inter-layer dielectric layer 50 and the gate insulating layer 30.

In the present array substrate, the plurality of first thin film transistors 11 are a plurality of top gate-type thin film transistors, which have a relatively small parasitic capacitance. Moreover, the first conductive part 212 and the second conductive part 213 (e.g., the portion of the first active layer 21 other than the first semi-conductive channel part 211) are conductorized portions, further decreasing the parasitic capacitance of the plurality of first thin film transistors 11 and increasing the on-state current of the plurality of first thin film transistors 11. Accordingly, the present array substrate is suitable for display apparatuses having a high refresh rate, and particularly suitable for display apparatuses having large-size display panels.

As shown in FIGS. 2A to 2C, in some embodiments, an orthographic projection of the first drain electrode 61 on the base substrate 10 at least partially overlaps with an orthographic projection of the capacitor electrode 43 on the base substrate 10. Optionally, the orthographic projection of the first drain electrode 61 on the base substrate 10 substantially overlaps with the orthographic projection of the orthographic projection of the capacitor electrode on the base substrate 10.

Figure 3:
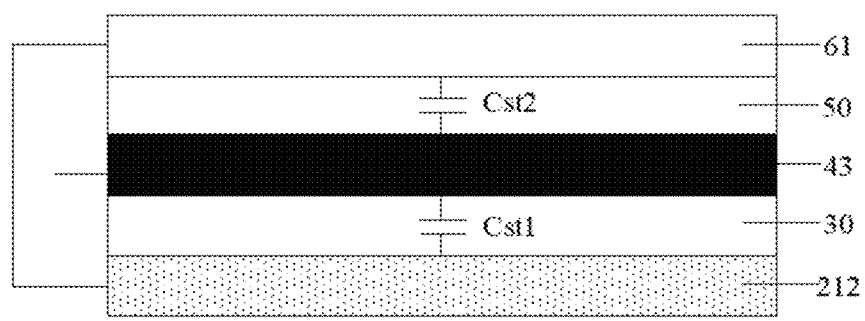
FIG. 3 is a schematic diagram illustrating the structure of a storage capacitor in a subpixel area in an array substrate in some embodiments according to the present disclosure.

The first drain electrode 61 is electrically connected with, and has a substantially the same voltage level as, the first conductive part 212. The first drain electrode 61 is spaced apart from the capacitor electrode 43 by the inter-layer dielectric layer 50. Thus, a storage capacitance is also formed between the first drain electrode 61 and the capacitor electrode 43. FIG. 3 is a schematic diagram illustrating the structure of a storage capacitor in a subpixel area in an array substrate in some embodiments according to the present disclosure. Referring to FIG. 3, each of the plurality of storage capacitors Cst includes a first storage capacitor Cst1 formed between the capacitor electrode 43 and the first conductive part 212 and a second storage capacitor Cst2 formed between the capacitor electrode 43 and the first drain electrode 61. The first storage capacitor Cst1 and the second storage capacitor Cst2 are connected in parallel with one another to collectively constitute one of the plurality of storage capacitors Cst. Optionally, the first drain electrode 61 may be designed to have an increased area so that orthographic projections of the capacitor electrode 43 and the first drain electrode. 61 on the base substrate 10 overlap as much as possible, to achieve a large storage capacitance. By having this design, the capacitance of each of the plurality of storage capacitors Cst can be further enhanced, achieving a higher aperture ratio and display resolution in a display apparatus having the present array substrate.

Typically, the inter-layer dielectric layer 50 has a thickness greater than a thickness of the gate insulating layer 30. Nonetheless, the inter-layer dielectric layer 50 is still prone to defects such as line open that may result in short between electrodes on two sides of the inter-layer dielectric layer 50. Optionally, the inter-layer dielectric layer 50 has a relatively large thickness to prevent defects such as line open. Although a greater thickness of the inter-layer dielectric layer 50 results in a smaller Cst2, the value of Cst in the present array substrate does not solely depend on Cst2, but is a combination of Cst1 and Cst2. Thus, the present array substrate allows the inter-layer dielectric layer 50 to have a relatively greater thickness to prevent line open defect. Optionally, the, inter-layer dielectric layer 50 has a thickness in a range of approximately 5000 Å to approximately 7000 Å.

Figure 4A:
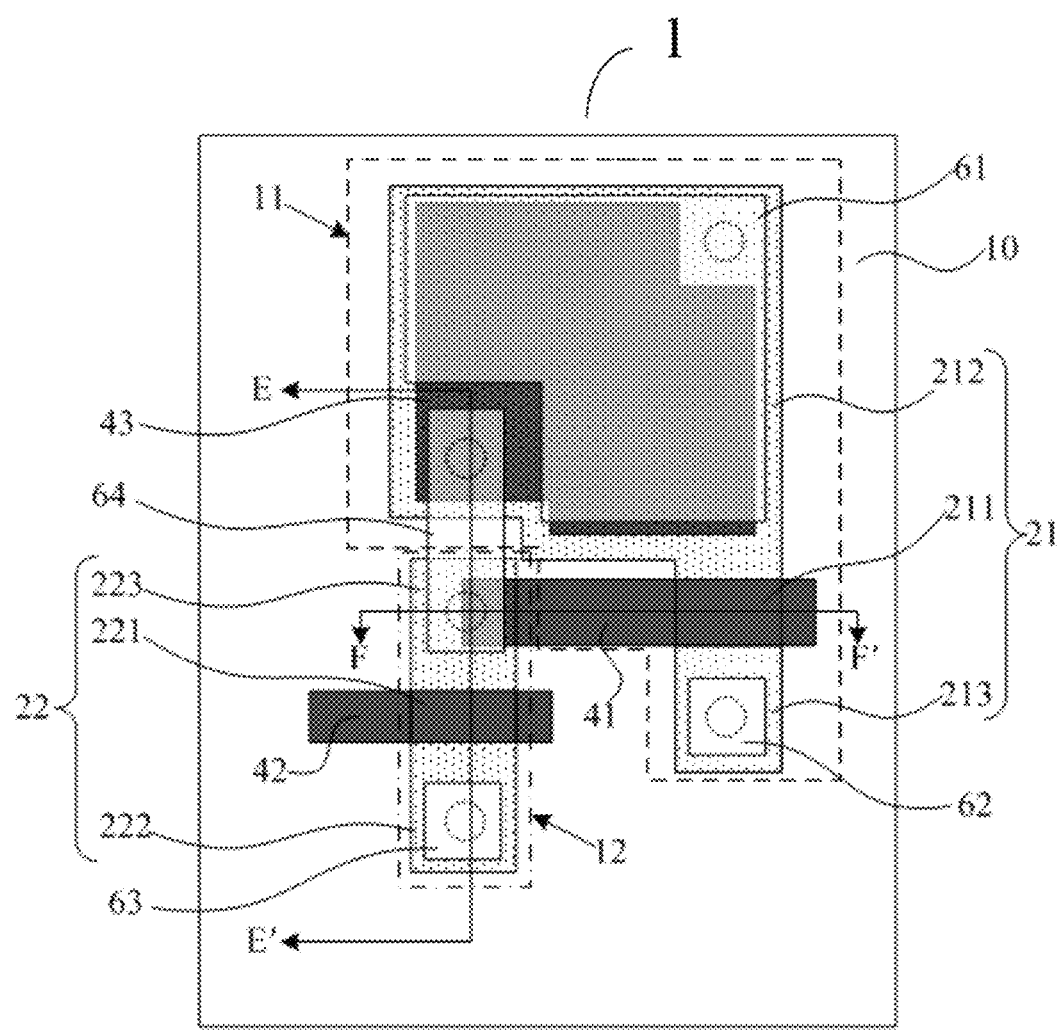
FIG. 4A is a schematic diagram illustrating the structure of a subpixel area in an array substrate in some embodiments according to the present disclosure.
Figure 4B:
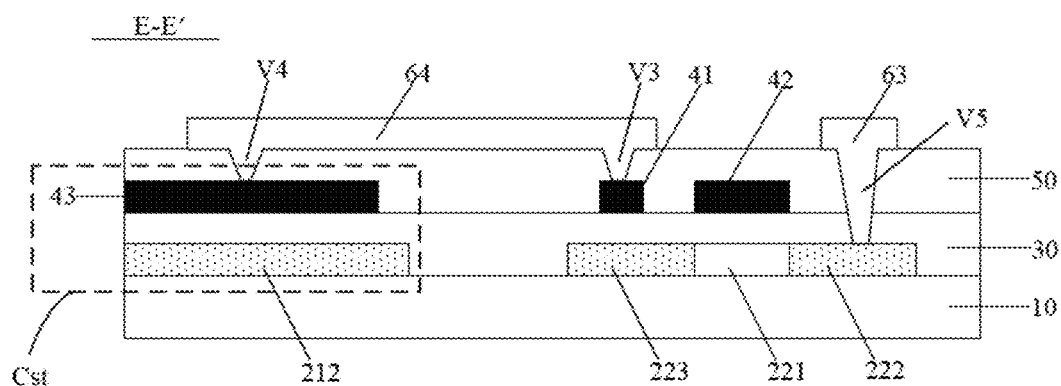
FIG. 4B is a cross-sectional view along E-E' line of the array substrate in FIG. 4A.
Figure 4C:
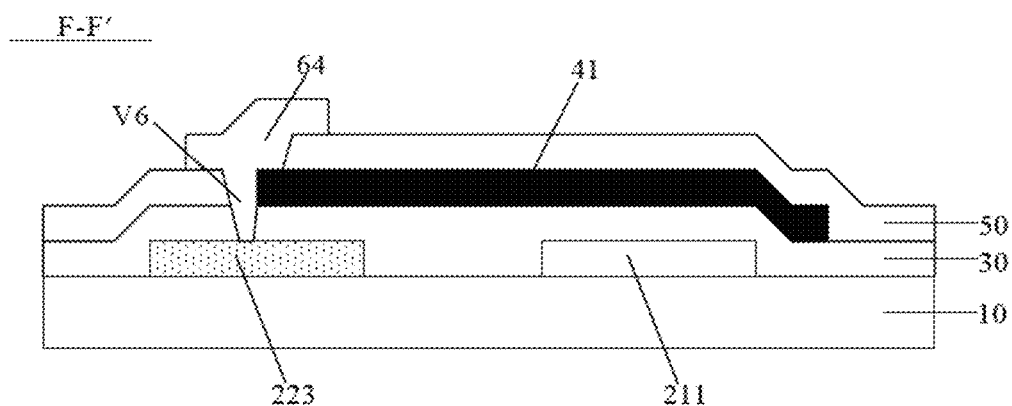
FIG. 4C is a cross-sectional view along F-F' line of the array substrate in FIG. 4A.

FIG. 4A is a schematic diagram illustrating the structure of a subpixel area in an array substrate in some embodiments according to the present disclosure. FIG. 4B is a cross-sectional view along E-E' line of the array substrate in FIG. 4A. FIG. 4C is a cross-sectional. view along F-F' line of the array substrate in FIG. 4A. Referring to FIGS. 4A to 4C, the array substrate in some embodiments further includes a plurality of second thin film transistors 12. Each of the plurality of second thin film transistors 12 is in one of the plurality of subpixel areas 1. Each of the plurality of second thin film transistors 12 includes a second active layer 22, a second gate electrode 42, a second source electrode 63, and a second drain electrode 64. Optionally, the second active layer 22 includes a second semi-conductive channel part 221, a third conductive part 222 electrically connected to the second source electrode 63, and a fourth conductive part 223 electrically connected to the second drain electrode 64. Optionally, an orthographic projection of the second semi-conductive channel part 221 on the base substrate 10 at least partially overlaps with an orthographic projection of the second gate electrode 42 on the base substrate 10.

The first active layer 21 and the second active layer 22 are insulated from each other (e.g., in a same layer but spaced apart from each other. Optionally, the first active layer 21 has an area greater than an area of the second active layer 22. For example, an orthographic projection of the first active layer 21 on the base substrate 10 has an area greater than an area of an orthographic projection of the second active layer 22 on the base substrate 10.

In some embodiments, the capacitor electrode 43 is electrically connected to the first gate electrode 41 through the second drain electrode 64. As shown in FIG. 4B, in some embodiments, the second drain electrode 64 is electrically connected to the first gate electrode 41 through a third via V3 extending through the inter-layer dielectric layer 50, and the second drain electrode 64 is electrically connected to the capacitor electrode 43 through a fourth via V4 extending through the inter-layer dielectric layer 50.

Figure 5:
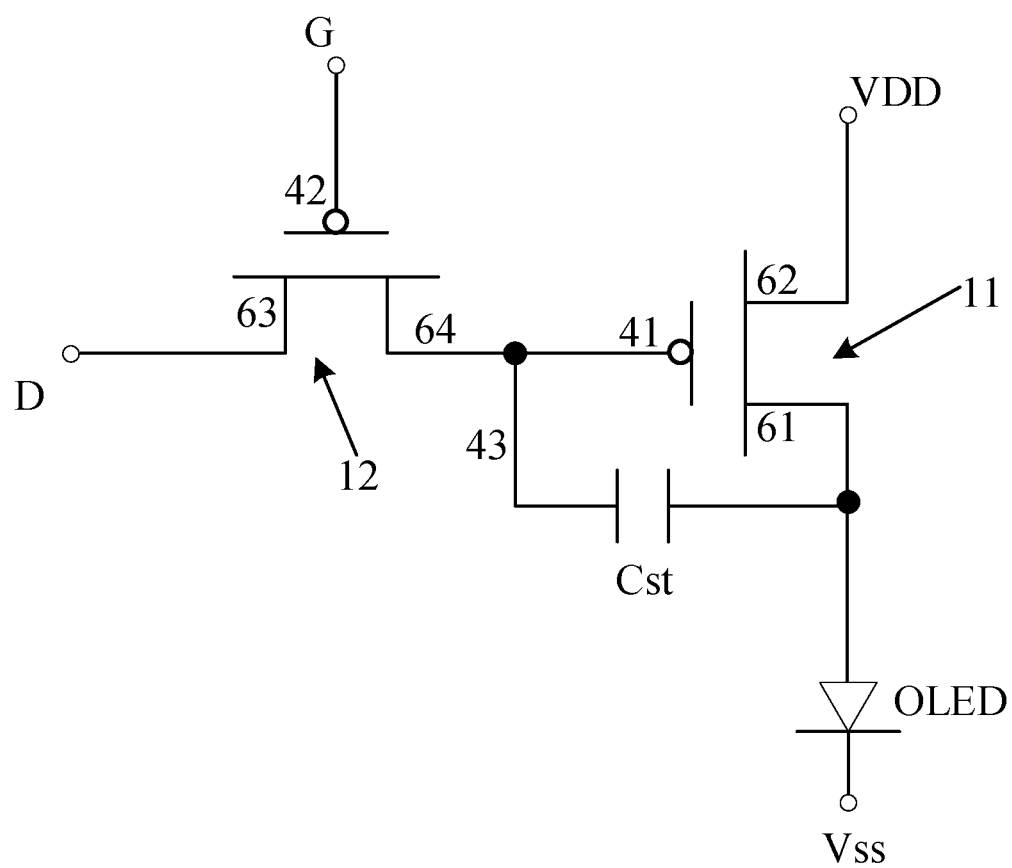
FIG. 5 is a circuit diagram of a circuit for forming a storage capacitor in a subpixel area in an array substrate in some embodiments according to the present disclosure.

FIG. 5 is a circuit diagram of a circuit for forming a storage capacitor in a subpixel area in an array substrate in some embodiments according to the present disclosure. Referring to FIG. 5, in some embodiments, each of the plurality of second thin film transistor 12 is a switch thin film transistor, the second gate electrode 42 is electrically connected to a gate G, and the second source electrode 63 is electrically connected to a data line D. In some embodiments, each of the plurality of first thin film transistor 11 is a driving thin film transistor, the first drain electrode 61 is electrically connected to a display component (e.g., an organic light emitting diode OLED), thereby driving light emission of the display component. Optionally, the first source electrode 62 is electrically connected to a power supply line VDD providing a high voltage signal. Optionally, the capacitor electrode 43 is electrically connected to the first gate electrode 41 through the second drain electrode 64.

Optionally, the third conductive part 222 is a source electrode contact part of the second active layer 22, and the fourth conductive part 223 is a drain electrode contact part of the second active layer 22. As shown in FIG. 4B, the second source electrode 63 is electrically connected to the third conductive part 222 through a fifth via. V5 extending through the inter-layer dielectric layer 50 and the gate insulating layer 30. As shown in FIG. 4C, the second drain electrode 64 is electrically connected to the fourth conductive part 223 through a sixth via V6 extending through the inter-layer dielectric layer 50 and the gate insulating layer 30.

In some embodiments, the first active layer 21 and the second active layer 22 are in a same layer. Optionally, the first gate electrode 41, the second gate electrode 42, and the capacitor electrode 43 are in a same layer. Optionally, the first source electrode 62, the first drain electrode 61, the second source electrode 63, and the second drain electrode 64 are in a same layer. By having this design, the fabricating process can be greatly simplified. Optionally, when the first active layer 21 and the second active layer 22 are in a same layer, they can be disposed to be spaced apart by a certain distance to ensure they are insulated from each other.

In some embodiments. and referring to FIG. 5, the array substrate further includes a plurality of organic light emitting diodes OLED, each of which being in one of the plurality of subpixel areas. Optionally, each of the plurality of organic light emitting diodes OLED includes a first electrode, a second electrode, and an organic light emitting layer between the first electrode and the second electrode.

Optionally, the first electrode is electrically connected to the first drain electrode 61. Optionally, the first electrode is an anode and the second electrode is a cathode. Optionally, the first electrode is a cathode and the second electrode is an anode. Optionally, each of the plurality of organic light emitting diodes OLED further includes one or more of a hole injection layer, a hole transport layer, an electron injection layer, and an electron transport layer.

In some embodiments. each of the plurality of organic light emitting diodes OLED is a top emitting organic light emitting diode. For example, the organic light emitting layer is on a side of the first electrode distal to the base substrate 10, the second electrode is on a side of the organic light emitting layer distal to the first electrode, and the first electrode is electrically connected to the first drain electrode 61. Optionally, the first electrode is an anode. Optionally, the first electrode is light non-transmissive, and the second electrode is a light transmissive (e.g., substantially transparent).

Optionally, the first electrode is made of a high work function material, and the second electrode is made of a low work function material. In one example, the first electrode includes a laminated structure including three sub-layers, e.g., an indium tin oxide/silver/indium tin oxide laminated structure in which a silver sub-layer is laminated by two indium tin oxide sub-layers on two opposite sides of the silver sub-layer. Optionally, the second electrode is made of a low work function material such as silver. Optionally, the second electrode has a relatively small thickness to permit light transmitting through the second electrode.

By having a plurality of top emitting organic light emitting diodes as the plurality of organic light emitting diodes OLED in the present array substrate, the aperture ratio and display resolution of the display apparatus having the present array substrate can be further enhanced. Thus, the present array substrate is suitable for making high fidelity, high definition display apparatuses having a 4K or even 8K or higher resolution.

In some embodiments, the array substrate includes a base substrate 10; a plurality of first thin film transistors 11 on the base substrate 10, each of which being in one of the plurality of subpixel areas 1; a plurality of second thin film transistors 12, each of which being in one of the plurality of subpixel areas 1; and a plurality of storage capacitors Cst, each of which being in one of the plurality of subpixel areas 1. The array substrate further includes a gate insulating layer 30 between the first active layer 21 and the first gate electrode 41, and between the capacitor electrode 43 and the first active layer 21; and an inter-layer dielectric layer 50 on a side of the first gate electrode 41 distal to the base substrate 10. Optionally, the gate insulating layer 30 is on a side of the first active layer 21 distal to the base substrate 10, the first gate electrode 41 is on a side of the gate insulating layer 30 distal to the first active layer 21, and the first source electrode 62 and the first drain electrode 61 are on a side of the inter-layer dielectric layer 50 distal to the base substrate 10. Optionally, each of the plurality of first thin film transistors 11 includes a first active layer 21, a first gate electrode 41, a first source electrode 62, and a first drain electrode 61; and each of the plurality of second thin film transistors 12 includes a second active layer 22, a second gate electrode 42, a second source electrode 63, and a second drain electrode 64. Optionally, the first active layer 21 includes a first semi-conductive channel part 211, a first conductive part 212 electrically connected to the first drain electrode 61, and a second conductive part 213 electrically connected to the first source electrode 62. Optionally, the second active layer 22 includes a second semi-conductive channel part 221, a third conductive part 222 electrically connected to the second source electrode 63, and a fourth conductive part 223 electrically connected to the second drain electrode 64. Optionally, each of the plurality of storage capacitors Cst includes a capacitor electrode 43 electrically connected to the first gate electrode 41 and insulated from the first active layer 21. Optionally, each of the plurality of storage capacitors Cst includes a first storage capacitor Cst1 formed between the capacitor electrode 43 and the first conductive part 212 and a second storage capacitor Cst2 formed between the capacitor electrode 43 and the first drain electrode 61, the first storage capacitor Cst1 and the second storage capacitor Cst2 being connected in parallel with one another to collectively constitute one of the plurality of storage capacitors Cst. Optionally, the capacitor electrode 43 is electrically connected to the first gate electrode 41 through the second drain electrode 64.

Various appropriate materials may be used for making the first active layer 21 and the second active layer 22. Examples of appropriate semi-conductive materials for making the first active layer 21 and the second active layer 22 (e.g., the first semi.-conductive Channel part 211 and the second semi-conductive channel part 221) include metal oxides, amorphous silicon, poly-crystalline silicon., and various organic semi-conductive materials. Example of appropriate metal oxides include amorphous indium gallium zinc oxide, zinc oxynitride, indium zinc tin oxide, and so on. Example of appropriate organic semi-conductive materials include sexithiaphene and polythiophene. Optionally, the first conductive part 212, the second conductive part 213, the third conductive part 222, and the fourth conductive part 223 includes a conductive material. Optionally, the conductive material of one or more of the first conductive part 212, the second conductive part 213. the third conductive part 222, and the fourth conductive part 223 includes at least one element in common with the semi-conductive material of the first semi-conductive channel part 211 or the second semi-conductive channel part 221. Optionally, the conductive material of one or more of the first conductive part 212, the second conductive part 213, the third conductive part 222, and the fourth conductive part 223 is converted from the semi-conductive material of the first semi-conductive channel part 211 or the second semi-conductive channel part 221 by a plasma treatment. Optionally, the first semi-conductive channel part 211 or the second semi-conductive channel part 221 includes a metal oxide semi-conductive material, and one or more of the first conductive part 212, the second conductive part 213, the third conductive part 222, and the fourth conductive part 223 includes a reductive plasma-treated metal oxide semi-conductive material. For example, the first semi-conductive channel part 211 or the second semi-conductive channel part 221 includes a metal oxide semi-conductive material, and one or more of the first conductive part 212, the second conductive part 213, the third conductive part 222, and the fourth conductive part 223 includes a partially metalized metal oxide semi-conductive material formed by a conductive treatment performed by reducing the oxygen content of one or more of the first conductive part 212, the second conductive part 213, the third conductive part 222, and the fourth conductive part 223. Optionally, the conductive treatment includes a plasma treatment by, e.g., a hydrogen plasma, a helium plasma, a nitrogen plasma, an argon plasma, a $NH_3$ plasma, or a combination thereof. Optionally, one or more of the first conductive part 212, the second conductive part 213, the third conductive part 222, and the fourth conductive part 223 includes a metal, and the first semi-conductive channel part 211 or the second semi-conductive channel part 221 includes an oxidative plasma-treated metal material.

Various appropriate insulating materials and various appropriate fabricating methods may be used to make the inter-layer dielectric layer 50 and the gate insulating layer 30. For example, an insulating material may be deposited on the substrate by a plasma-enhanced chemical vapor deposition (PECVD) process. Examples of appropriate insulating materials include, but are not limited to, polyimide, silicon oxide ($SiO_y$), silicon nitride ($SiN_y$, e.g., $Si_3N_4$), silicon oxynitride ($SiO_xN_y$), and high dielectric constant (k) materials such as aluminum oxide ($AlO_x$), hafnium oxide ($HfO_x$), and tantalum oxide ($TaO_x$).

Various appropriate electrode materials and various appropriate fabricating methods may be used to make the first gate electrode 41, the second gate electrode 42, the first source electrode 62, the first drain electrode 61, the second source electrode 63, the second drain electrode 64, and the capacitor electrode 43. For example, an electrode material may be deposited on the substrate, e.g., by sputtering or vapor deposition or solution coating; and patterned. Examples of appropriate electrode materials for making the first gate electrode 41, the second gate electrode 42, the first source electrode 62, the first drain electrode 61, the second source electrode 63, the second drain electrode 64, and the capacitor electrode 43 include, but are not limited to, silver, copper, aluminum, molybdenum, alloys such as aluminum Neodymium (AlNd) and molybdenum Niobium (MoNb), and laminates thereof (e.g., a molybdenum-copper-molybdenum laminated structure).

In another aspect, the present disclosure provides a method of fabricating an array substrate having a plurality of subpixel areas. In some embodiments, the method includes forming a plurality of first thin film transistors on a base substrate, each of which being formed in one of the plurality of subpixel areas; and forming a plurality of capacitor electrodes, each of which being formed in one of the plurality of subpixel areas. Optionally, forming each of the plurality of first thin film transistors includes forming a first active layer, forming a first gate electrode, forming a first source electrode, and forming a first drain electrode. Optionally, forming the first active layer includes forming a first semi-conductive channel part, forming a first conductive part electrically connected to the first drain electrode, and forming a second conductive part electrically connected to the first source electrode. Optionally, the first semi-conductive channel part and the first gate electrode are formed so that an orthographic projection of the first semi-conductive channel part on the base substrate at least partially overlaps with an orthographic projection of the first gate electrode on the base substrate. Optionally, each of the plurality of capacitor electrodes is formed to be electrically connected to the first gate electrode of one of the plurality of thin film transistors and insulated from the first active layer of one of the plurality of thin film transistors by an insulating layer. Optionally, the plurality of capacitor electrodes and the plurality of first thin film transistors are formed so that an orthographic projection of one of the plurality of capacitor electrodes on the base substrate at least partially overlaps with an orthographic projection of the first conductive part of one of the plurality of thin film transistors on the base substrate. Optionally, the plurality of capacitor electrodes and the plurality of first thin film transistors are formed so that an orthographic projection of one of the plurality of capacitor electrodes on the base substrate substantially overlaps with an orthographic projection of the first conductive part of one of the plurality of thin film transistors on the base substrate. Optionally, the plurality of first thin film transistors and the plurality of capacitor electrodes are formed so that an orthographic projection of the first drain electrode of one of the plurality of thin film transistors on the base substrate at least partially overlaps with an orthographic projection of one of the plurality of capacitor electrodes on the base substrate. Optionally, the plurality of first thin film transistors and the plurality of capacitor electrodes are formed so that an orthographic projection of the first drain electrode of one of the plurality of thin film transistors on the base substrate substantially overlaps with an orthographic projection of one of the plurality of capacitor electrodes on the base substrate. Optionally, each of the plurality of capacitor electrodes, the insulating layer, and the first conductive part of one of the plurality of thin film transistors constitute a first storage capacitor in one of the plurality of subpixel areas.

In some embodiments, forming the first active layer includes forming a first semi-conductive material layer on the base substrate; and applying a conductive treatment on a first part and a second part of the first semi-conductive material layer thereby forming the first conductive part and the second conductive part. Optionally, a third part of the first semi-conductive material layer between the first part and the second part of the second semi-conductive material layer is substantially untreated by the conductive treatment thereby forming the first channel part. Optionally, the conductive treatment is performed using a. plasma, e.g., a hydrogen plasma, a helium plasma, a nitrogen plasma, an argon plasma, a $NH_3$ plasma, or a combination thereof.

Optionally, the first active layer is formed so that the first conductive part has an area larger than an area of the second conductive part, e.g., an orthographic projection of the first conductive part on the base substrate has an area larger than an area of an orthographic projection of the second conductive part on the base substrate.

Optionally, the method further includes forming a gate insulating layer between the first active layer and the first gate electrode, and between the capacitor electrode and the first conductive part. Optionally, the gate insulating layer is formed to have a thickness in a range of approximately 1500 Å to approximately 2000 Å.

Optionally, the capacitor electrode and the first gate electrode are formed in a same layer, in a same patterning process, and using a same electrode material.

In some embodiments, each of the plurality of first thin film transistors is a top gate-type thin film transistor. Optionally, the gate insulating layer is formed on a side of the, first active layer distal to the base substrate; and the first gate electrode is formed on a side of the gate insulating layer distal to the first active layer.

In some embodiments, the method further includes forming an inter-layer dielectric layer, on a side of the first gate electrode distal to the base substrate. Optionally, the first source electrode and the first drain electrode are formed on a side of the inter-layer dielectric layer distal to the base substrate. Optionally, each of the plurality of storage capacitors is formed to includes the first storage capacitor formed between the capacitor electrode and the first conductive part and a second storage capacitor formed between the capacitor electrode and the first drain electrode, the first storage capacitor and the second storage capacitor being connected in parallel with one another to collectively constitute one of the plurality of storage capacitors. Optionally, the inter-layer dielectric layer is formed to have a thickness in a range of approximately 5000 Å to approximately 7000 Å.

In some embodiments, the method further includes forming a plurality of second thin film transistors, each of which being formed in one of the plurality of subpixel areas. Optionally, forming each of the plurality of second thin film transistors includes forming a second active layer, forming a second gate electrode, forming a second source electrode, and forming a second drain electrode. Optionally, forming the second active layer includes forming a second semi-conductive channel part, forming a third conductive part electrically connected to the second source electrode, and forming a fourth conductive part electrically connected to the second drain electrode. Optionally, the capacitor electrode is formed to be electrically connected to the first gate electrode through the second drain electrode. Optionally, the second active layer is formed so that an orthographic projection of the second semi-conductive channel part on the base substrate at least partially overlaps with an orthographic projection of the second gate electrode on the base substrate.

In some embodiments, forming the second active layer includes forming a second semi-conductive material layer on the base substrate; and applying a conductive treatment on a first part and a second part of the second semi-conductive material layer thereby forming the third conductive part and the fourth conductive part. Optionally, a third part of the second semi-conductive material layer between the first part and the second part of the second semi conductive material layer is substantially untreated by the conductive treatment thereby forming the second channel part. Optionally, the conductive treatment is performed using a plasma, e.g., a hydrogen plasma, a helium plasma, a nitrogen plasma, an argon plasma, a NH$_3$ plasma, or a combination thereof.

The first active layer and the second active layer are formed to be insulated from each other. Optionally, the first active layer is formed to have an area greater than an area of the second active layer, e.g., an orthographic projection of the first active layer on the base substrate has an area greater than an area of an orthographic projection of the second active layer on the base substrate.

Optionally, the first active layer and the second active layer are formed in a same layer, in a same patterning process, and using a same semi-conductive material. Optionally, the first gate electrode, the second gate electrode, and the capacitor electrode are formed in a same layer, in a same patterning process, and using a same electrode material. Optionally, the first source electrode, the first drain electrode, the second source electrode, and the second chain electrode are formed in a same layer, in a same patterning process, and using a same electrode material.

In some embodiments, the method further includes forming a plurality of organic light emitting diodes, each of which being formed in one of the plurality of subpixel areas. Optionally, forming each of the plurality of organic light emitting diodes includes forming a first electrode, forming a second electrode, and forming an organic light emitting layer between the first electrode and the second electrode. Optionally, the first electrode is formed to be electrically connected to the first drain electrode. Optionally, each of the plurality of organic light emitting diodes is a top emitting organic light emitting diode. Optionally, forming each of the plurality of organic light emitting diodes OLED further includes forming one or more of a hole injection layer, a hole transport layer, an electron injection layer, and an electron transport layer.

In some embodiments, each of the plurality of organic light emitting diodes OLED is a top emitting organic light emitting diode. For example, the organic light emitting layer is formed on a side of the first electrode distal to the base substrate 10, the second electrode is formed on a side of the organic light emitting layer distal to the first electrode, and the first electrode is formed to be electrically connected to the first drain electrode 61. Optionally, the first electrode is an anode. Optionally, the first electrode is light non-transmissive, and the second electrode is a light transmissive (e.g., substantially transparent).

Optionally, the first electrode is made of a high work function material, and the second electrode is made of a low work function material. In one example, the first electrode includes a laminated structure including three sub-layers, e.g., an indium tin oxide/silver/indium tin oxide laminated structure in which a silver sub-layer is laminated by two indium tin oxide sub-layers on two opposite sides of the silver sub-layer. Optionally, the second electrode is made of a low work function material such as silver. Optionally, the second electrode has a relatively small thickness to permit light transmitting through the second electrode.

By having a plurality of top emitting organic light emitting diodes as the plurality of organic light emitting diodes OLED in the present array substrate, the aperture ratio and display resolution of the display apparatus having the present array substrate can be further enhanced. Thus, the present array substrate is suitable for making high fidelity, high definition display apparatuses having a 4K or even 8K or higher resolution.

According to the present method, a first conductive part and a second conductive part are formed in each of the plurality of first thin film transistors in each of the plurality of subpixel areas, a capacitor electrode is then formed to constitute a storage capacitor with the first conductive part. In an array substrate formed by the present method, the first conductive part may be designed to have an increased area so that orthographic projections of the capacitor electrode and the first conductive part on the base substrate overlap as much as possible, to achieve a large storage capacitance. Based on this design, to achieve a certain storage capacitance, an area occupied by the plurality of storage capacitors can be minimized. to the extent possible, effectively enhancing the aperture ratio of the array substrate. Moreover, the adverse effects of thin film transistor parasitic capacitance during data signal input can be avoided in the present array substrate.

Figure 6A:
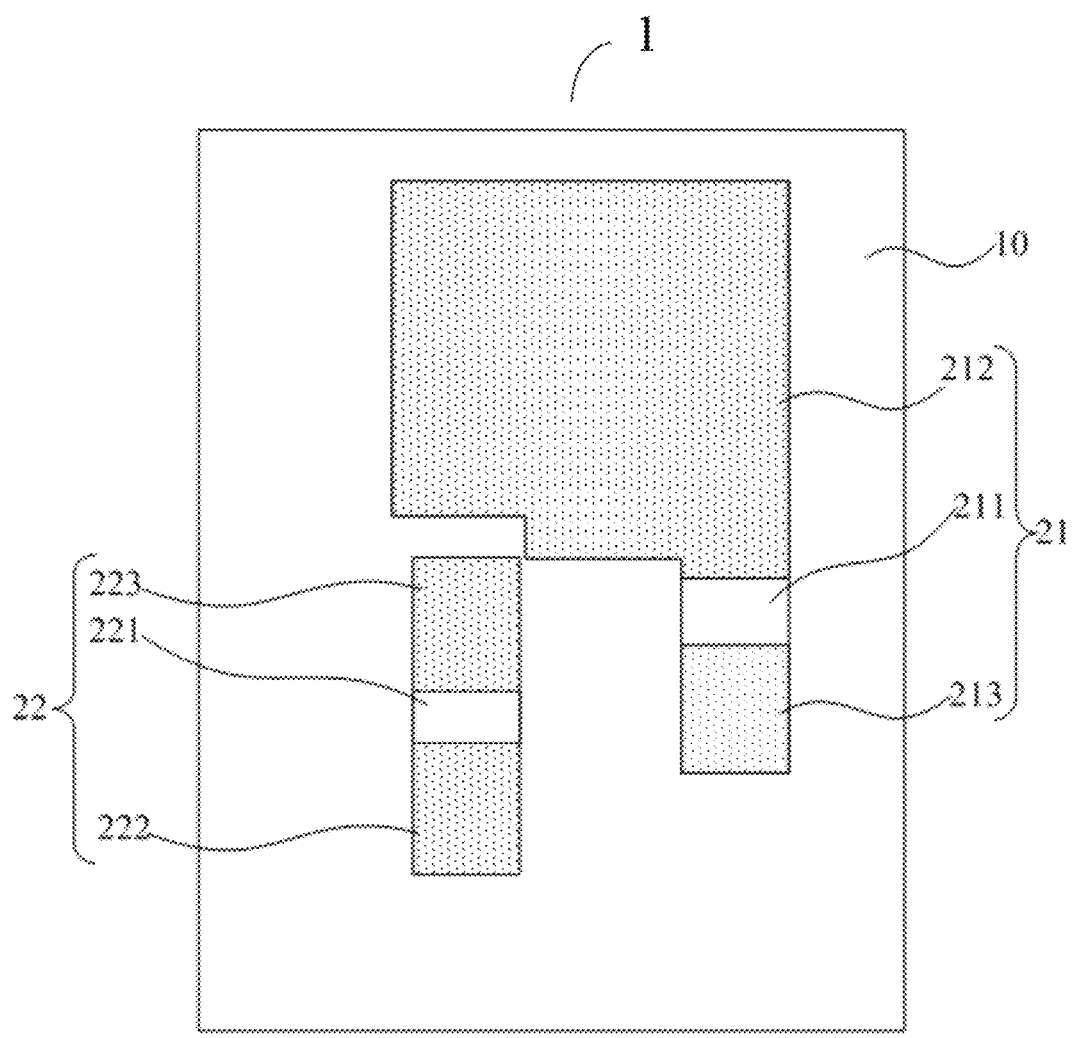
FIGS. 6A to 6C illustrate a process of forming an array substrate in some embodiments according to the present disclosure.
Figure 6B:
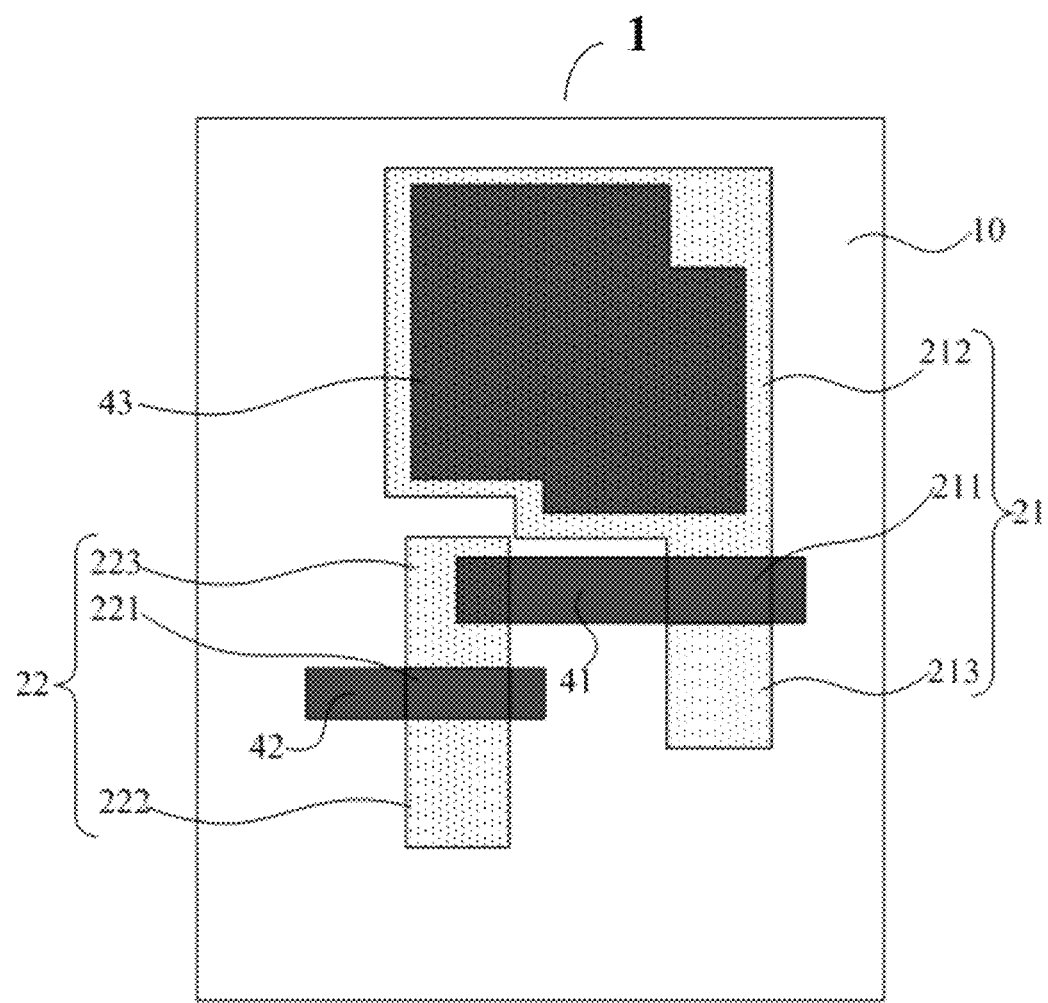
Figure 6C:
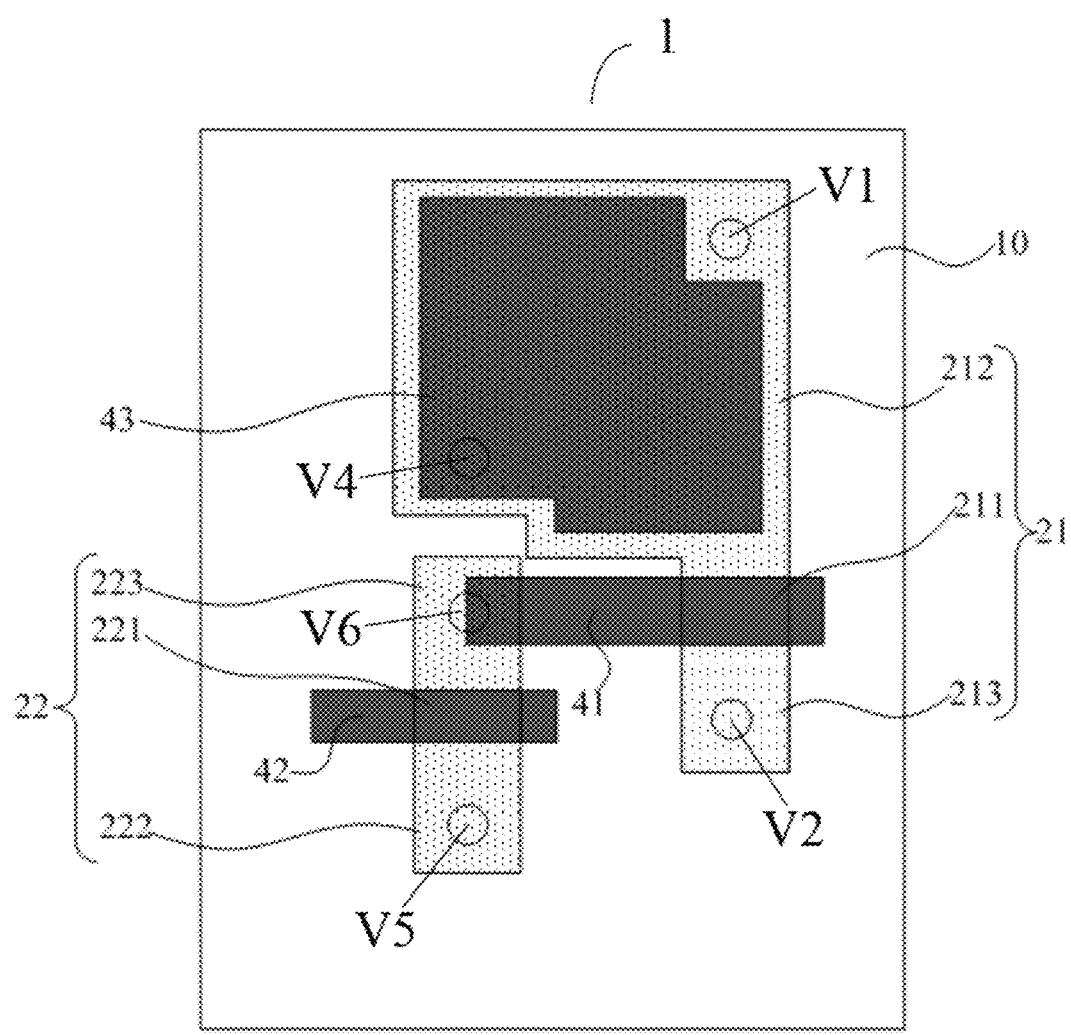

FIGS. 6A to 6C illustrate a process of forming an array substrate in some embodiments according to the present disclosure. Referring to FIG. 6A, in some embodiments, the first active layer 21 and the second active layer 22 are formed in a same layer, in a same patterning process, and using a same material. Referring to FIG. 6B, in some embodiments, the first gate electrode 41, the second gate electrode 42, and the capacitor electrode 43 are formed in a same layer, in a same patterning process, and using a same electrode material. Referring to FIG. 4A, in some embodiments, the first source electrode 62, the first drain electrode 61, the second source electrode 63, and the second drain electrode 64 are formed in a same layer, in a same patterning process, and using a same electrode material. By having this design, the fabricating process of the present array substrate can be greatly simplified. Optionally, the firsts active layer 21 and the second active layer 22 are formed to be spaced apart by a certain distance to ensure that they are insulated from each other.

Referring to FIG. 6C, in some embodiments, a first via V1 is formed to extend through the inter-layer dielectric layer and the gate insulating layer, the first drain electrode 61 is formed to be electrically connected to the first conductive part 212 through the first via V1. A second via V2 is formed to extend through the inter-layer dielectric layer and the gate insulating layer, the first source electrode 62 is formed to be electrically connected to the second conductive part 213 through the second via V2. A fifth via V5 is formed to extend through the inter-layer dielectric layer and the gate insulating layer, the second source electrode 63 is formed to be electrically connected to the third conductive part 222 through the fifth via V5. A sixth via V6 is formed to extend through the inter-layer dielectric layer and the gate insulating layer, the second drain electrode 64 is formed to be electrically connected to the fourth conductive part 223 through the sixth via V6. A fourth via V4 is formed to extend through the inter-laver dielectric layer, the second drain electrode 64 is formed to be electrically connected to the capacitor electrode 43 through the fourth via V4.

Various appropriate materials may be used for making the first active layer 21 and the second active layer 22. Examples of appropriate semi-conductive materials for making the first active layer 21 and the second active layer 22 (e.g., the first semi-conductive channel part 211 and the second semi-conductive channel part 221) include metal oxides, amorphous silicon, poly-crystalline silicon, and various organic semi-conductive materials. Example of appropriate metal oxides include amorphous indium gallium zinc oxide, zinc oxynitride, indium zinc tin oxide, and so on. Example of appropriate organic semi-conductive materials include sexithiophene and polythiophene.

Various appropriate electrode materials and various appropriate fabricating methods may be used to make the first gate electrode 41, the second gate electrode 42, the first source electrode 62, the first drain electrode 61, the second source electrode 63, the second drain electrode 64, and the capacitor electrode 43. For example, an electrode material may be deposited on the substrate, e.g., by sputtering or vapor deposition or solution coating; and patterned. Examples of appropriate electrode materials for making the first gate electrode 41, the second gate electrode 42, the first source electrode 62, the first drain electrode 61, the second source electrode 63, the second drain electrode 64, and the capacitor electrode 43 include, but are not limited to, silver, copper, aluminum, molybdenum, alloys such as aluminum Neodymium (AlNd) and molybdenum Niobium (MoNb), and laminates thereof (e.g., a molybdenum-copper-molybdenum laminated structure).

Various appropriate insulating materials and various appropriate fabricating methods may be used to make the inter-layer dielectric layer 50 and the gate insulating layer 30. For example, an insulating material may be deposited on the substrate by a plasma-enhanced chemical vapor deposition (PECVD) process. Examples of appropriate insulating materials include, but are not limited to, polyimide, silicon oxide ($SiO_x$), silicon nitride ($SiN_y$, e.g., $Si_3N_4$), silicon oxynitride ($SiON_3$), and high dielectric constant (k) materials such as aluminum oxide ($AlO_x$), hafnium oxide ($HfO_x$), and tantalum oxide ($TaO_x$).

Figure 7A:
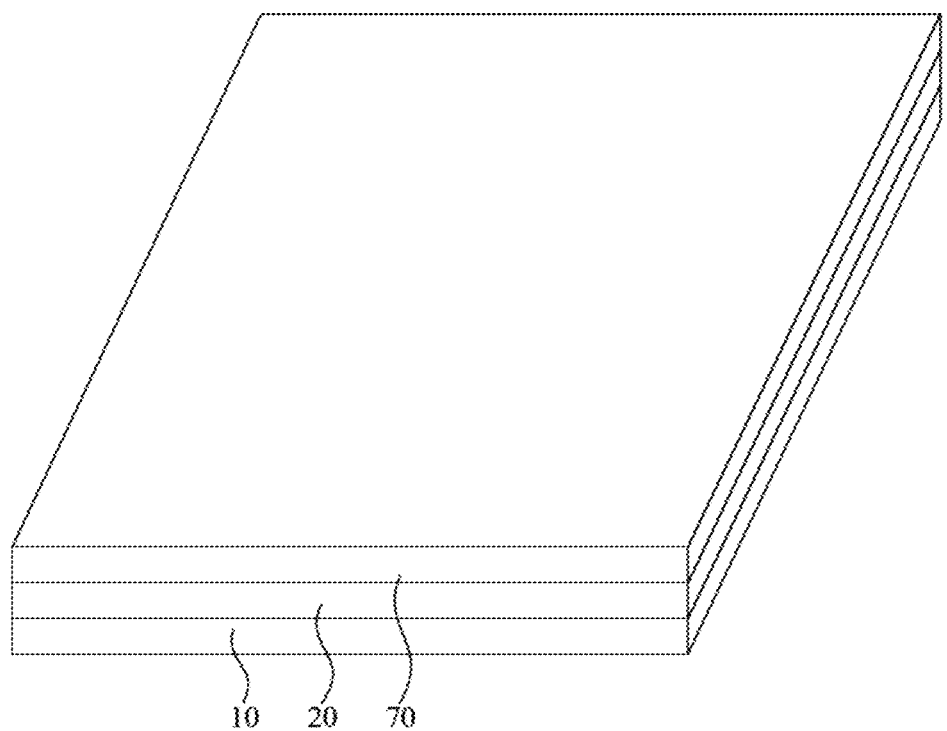
FIGS. 7A to 7F illustrate a process of forming an an'ay substrate in some embodiments according to the present disclosure.
Figure 7B:
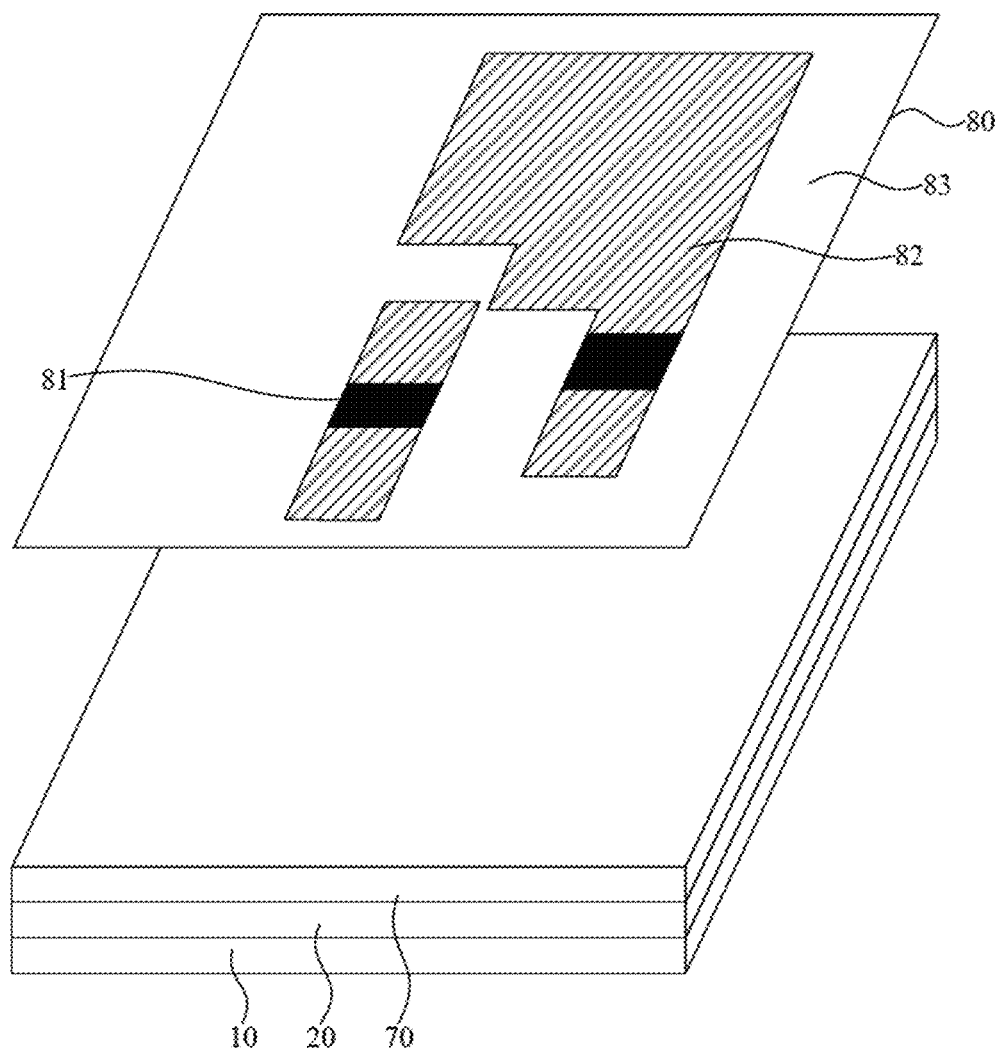
Figure 7C:
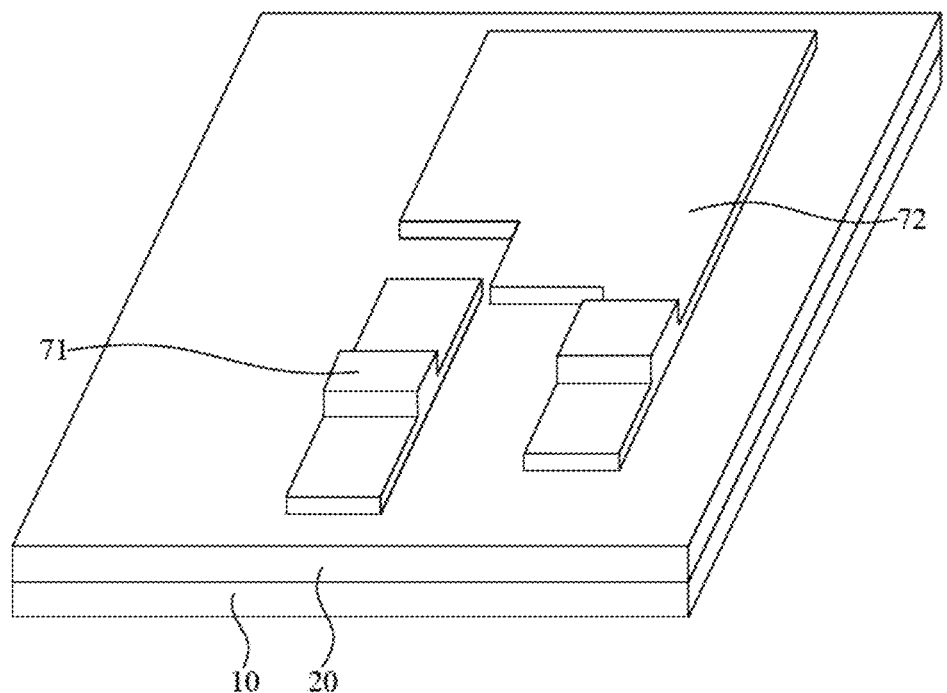

FIGS. 7A to 7F illustrate a process of forming an array substrate in some embodiments according to the present disclosure. Referring to FIG. 7A, a semi-conductive material layer 20 is formed on the base substrate 10, and a first photoresist layer 70 is formed on a side of the semi-conductive material layer 20 distal to the base substrate 10. Referring to FIG. 7B, a half-tone or gray-tone mask plate 80 is used for exposing the first photoresist layer 70. The half-tone or gray-tone mask plate 80 has a light non-transmissive region 81, a light semi-transmissive region 82, and a light fully transmissive region 83. Referring to FIG. 7C, the exposed first photoresist layer 70 is then developed to obtain a photoresist pattern having a first section 71, a second section 72, and a third section 73. The first section 71 corresponds to the first semi-conductive channel part of the first active layer and the second semi-conductive channel part of the second active layer. The second section 72 corresponds to the first conductive part and the second conductive part of the first active layer and, and the third conductive part and the fourth conductive part of the second active layer. The third section 73 is outside of the first section 71 and the second section 72. The first section 71 is substantially unexposed, the second section 72 is partially exposed, the third section 73 is fully exposed, and the photoresist material is removed in the third section 73.

The half-tone or gray-tone mask plate 80 in FIG. 7B is used for exposing a positive photoresist layer such as the first photoresist layer 70 in FIG. 7A. Optionally, the first photoresist layer 70 is a negative photoresist layer, and the half-tone or gray-tone mask plate 80 includes a light fully transmissive region 81, a light semi-transmissive region 82, and a light non-transmissive region 83.

Figure 7D:
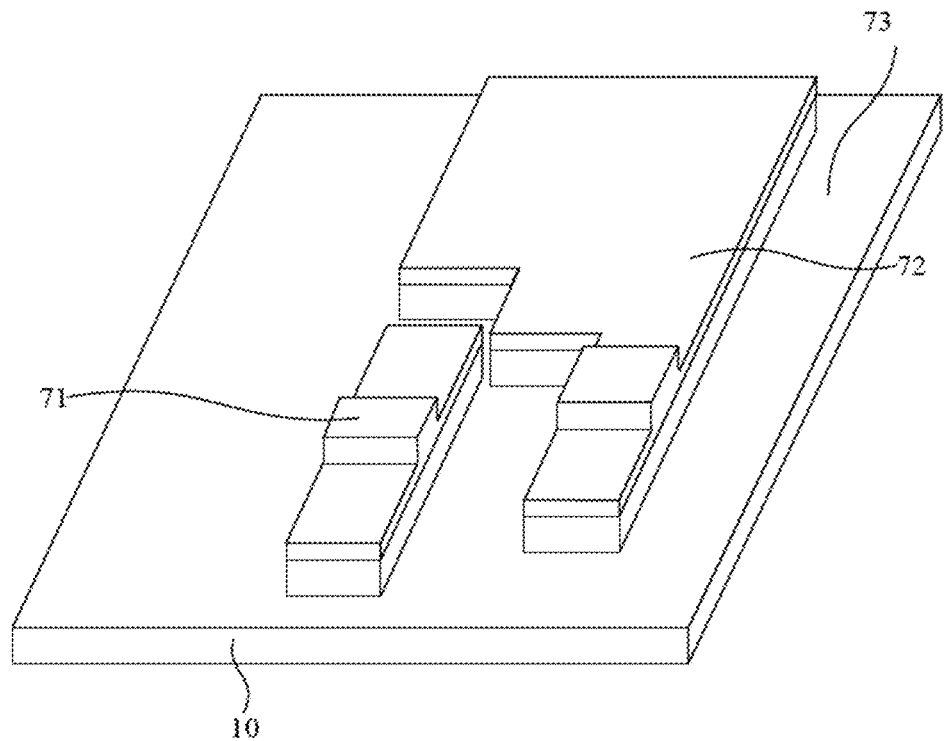
Figure 7E:
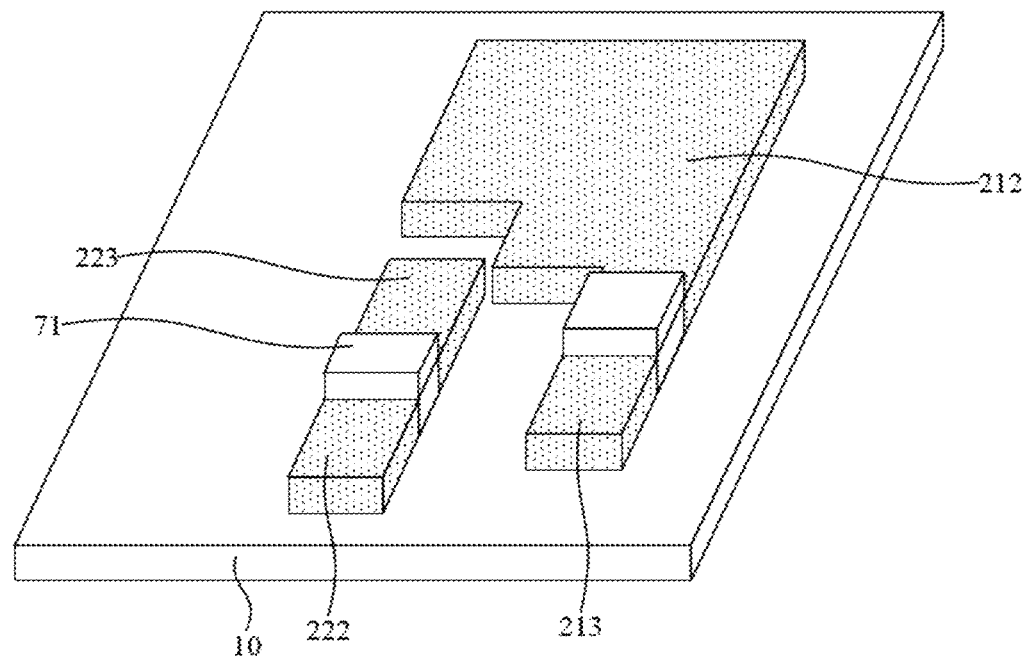

Referring to FIG. 7D, the semi-conductive material of the semi-conductive material layer 70 in the third section 73 is then removed. Optionally, the semi-conductive material of the semi-conductive material layer 70 in the third section 73 is removed by dry etching. Referring to FIG. 7E, the photoresist material in the second section 72 is then removed while the photoresist material in the first section 71 is maintained, thereby exposing the semi-conductive material in the region corresponding to the second section 72. The exposed semi-conductive material in the region corresponding to the second section 72 is then subject to a conductive treatment (conductorization), thereby forming the first conductive part 212 and the second conductive part 213 of the first active layer, and the third conductive part 222 and the fourth conductive part 223 of the second active layer. The semi-conductive material remained in the region corresponding to the first section 71 constitutes the first semi-conductive channel part and the second semi-conductive channel part.

Optionally, the photoresist material in the second section 72 is removed by asking.

Various appropriate conductive treatment methods may be used for treating the exposed semi-conductive material in the region corresponding to the second section 72. Examples of appropriate conductive treatment methods include plasma treatment, insert gas bombardment, and doping.

Figure 7F:
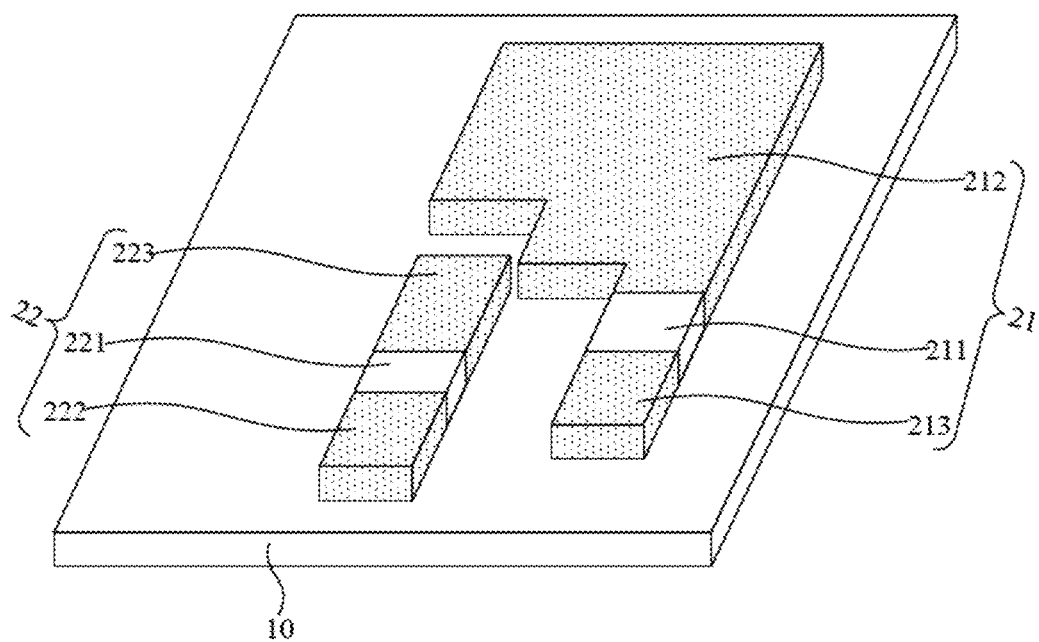

Referring to FIG. 7F, the photoresist material remained in the first section 71 is then removed, thereby exposing the first semi-conductive channel part 211 of the first active layer 21 and the second semi-conductive channel part 221 of the second active layer 22.

Figure 8A:
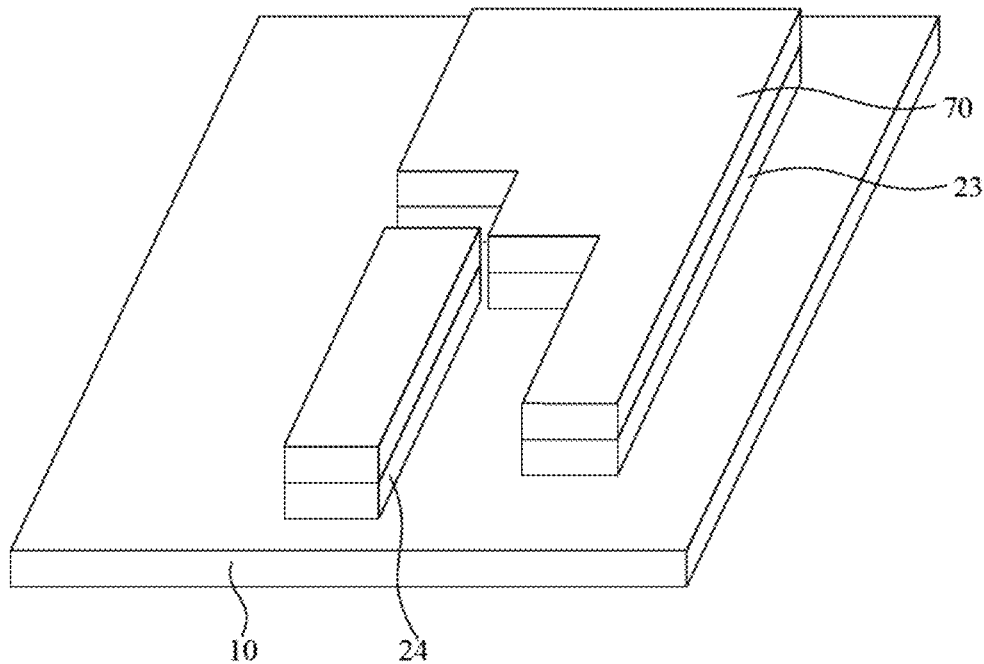
FIGS. 8A to 8C illustrate a process of forming an array substrate in some embodiments according to the present disclosure.
Figure 8B:
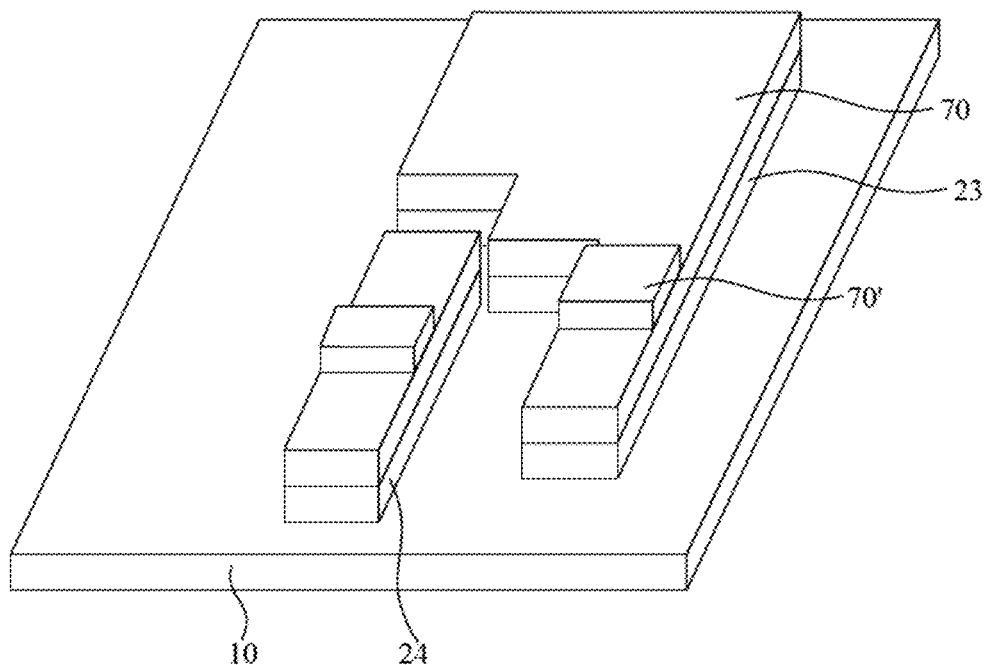
Figure 8C:
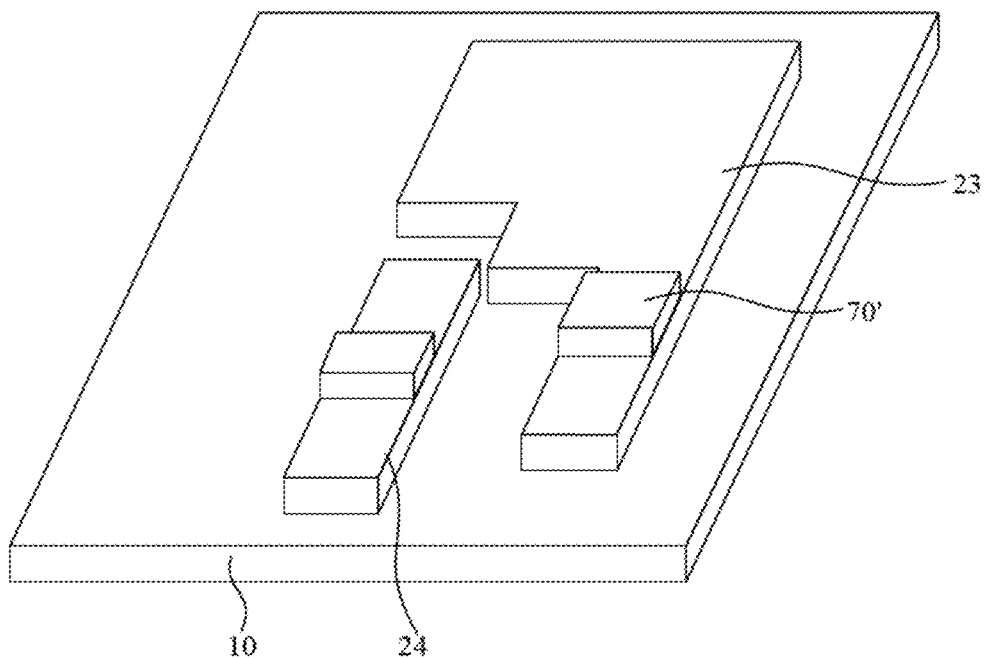

FIGS. 8A to 8C illustrate a process of forming an array substrate in some embodiments according to the present disclosure. Referring to FIG. 8A, a first semi-conductive material layer 23 and a second semi-conductive material layer 24 are formed on the base substrate 10, and a first photoresist layer 70 is formed on a side of the first semi-conductive material 23 and the second semi-conductive material layer 24 distal to the base substrate 10. The first semi-conductive material layer 23 is formed in a region corresponding to the first active layer, and the second semi-conductive material layer 24 is formed in a region corresponding to the second active layer. Specifically, the process includes forming a semi-conductive material layer on the base substrate 10; forming a first photoresist layer 70 on a side of the semi-conductive material layer distal to the base substrate 10; exposing the first photoresist layer 70 and developing the exposed first photoresist layer 70 to form a photoresist pattern corresponding to the first active layer and the second active layer; etching the semi-conductive material layer outside the photoresist pattern thereby forming the first semi-conductive material layer 23 and the second semi-conductive material layer 24. The first photoresist layer 70 on top of the first semi-conductive material layer 23 and the second semi-conductive material layer 24 is maintained.

Figure 9:
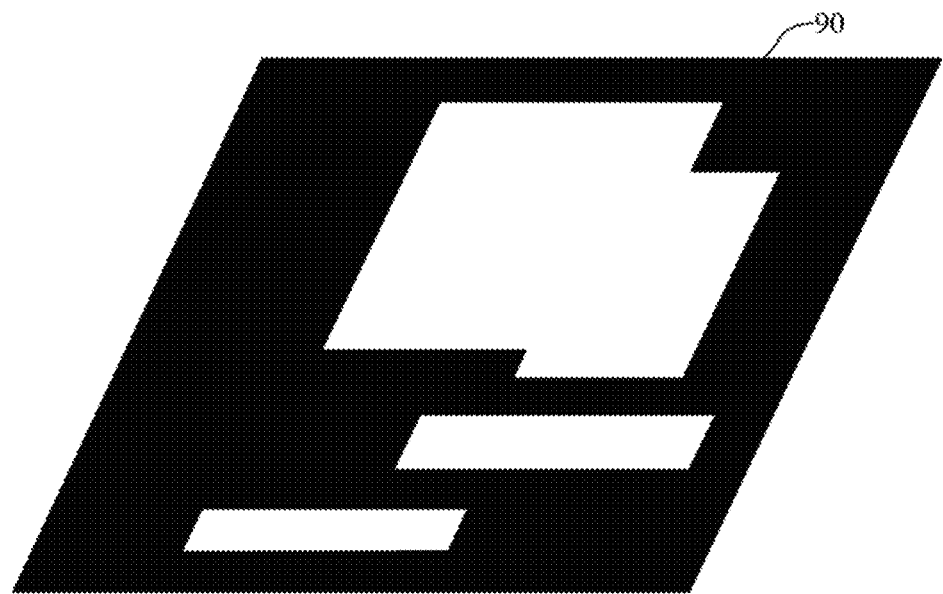
FIG. 9 is a schematic diagram illustrating the structure of a mask plate for fabricating an array substrate in some embodiments according to the present disclosure.

Referring to FIG. 8B, a second photoresist layer 70' is then fanned on top of the first photoresist layer 70. Optionally, the second photoresist layer 70' may be a negative photoresist layer. FIG. 9 is a schematic diagram illustrating the structure of a mask plate for fabricating an array substrate in some embodiments according to the present disclosure. In some embodiments, a mask plate 90 as shown in FIG. 9 may be used for selectively exposing the second photoresist layer 70'. The mask plate 90 includes light transmitting regions corresponding to the first gate electrode, the second gate electrode, and the capacitor electrode. After exposure using the mask plate 90, the second photoresist layer 70' is then developed to obtain a photoresist pattern in which the second photoresist layer 70' remains in regions corresponding to the first semi-conductive channel part of the first active layer and the second semi-conductive channel part of the second active layer.

An orthographic projection of the first semi-conductive channel part of the first active layer overlaps with an orthographic projection of the first gate electrode, and an orthographic projection of the second semi-conductive Channel part of the second active layer overlaps with an orthographic projection of the second gate electrode. During the selective exposure of the second photoresist layer 70', only regions where orthographic projections of the first semi-conductive channel part of the first active layer and the first gate electrode overlap with each other and orthographic projections of the second semi-conductive channel part of the second active layer and the second gate electrode overlap with each other are exposed.

Optionally, the selective exposure is performed by modifying a jobfile of the exposure apparatus. Because only regions where orthographic projections of the first semi-conductive channel part of the first active layer and the first gate electrode overlap with each other and orthographic projections of the second semi-conductive channel part of the second active layer and the second gate electrode overlap with each other are exposed during the selective exposure process, and the negative photoresist remains in these regions, subsequently a mask plate 90 having light transmitting regions corresponding the first gate electrode, the second gate electrode, and the capacitor electrode can be used as the mask plate for the conductive treatment.

Referring to FIG. 8C, the photoresist layers outside the regions corresponding to the first semi-conductive channel part of the first active layer and the second semi-conductive channel part of the second active layer are then removed, exposing the semi-conductive material underneath in regions corresponding to the first conductive part and the second conductive part of the first active layer, and the third conductive part and the fourth conductive part of the second active layer. A conductive treatment is then performed to treat the semi-conductive material in these regions, and conductorize the semi-conductive material in these regions, thereby forming the first conductive part and the second conductive part of the first active layer, and the third conductive part and the fourth conductive part of the second active layer. The semi-conductive material covered by the photoresist layer remains, thereby forming the first semi-conductive channel part of the first active layer and the second semi-conductive channel part of the second active layer (see also FIG. 7E).

Optionally, ashing is used to remove the photoresist material in regions outside the regions corresponding to the first semi-conductive channel part of the first active layer and the second semi-conductive channel part of the second active layer. Because the photoresist material in regions corresponding to the first semi-conductive channel part of the first active layer and the second semi-conductive channel part of the second active layer has a relatively greater thickness, the photoresist layer in these regions remains with a reduced thickness after the ashing process.

Subsequently, the remaining photoresist material in regions corresponding to the first semi-conductive channel part of the first active layer and the second semi-conductive channel part of the second active layer is removed.

By using, a mask plate 90 having light transmitting regions corresponding to the first gate electrode, the second gate electrode, and the capacitor electrode, no additional mask plate is required to for patterning the first active layer and the second active layer, the fabrication process is simplified and the cost reduced.

In another aspect, the present disclosure provides a display panel having the array substrate described herein or fabricated by a method described herein.

In another aspect, the present disclosure provides a display apparatus having the array substrate described herein or fabricated by a method described herein. Optionally, the display apparatus is a liquid crystal display apparatus. Optionally, the display apparatus is an organic light emitting diode display apparatus. Optionally, the display apparatus is an electrophoretic display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a base substrate;
a plurality of first thin film transistors, a plurality of second thin film transistors, and a plurality of capacitor electrodes on the base substrate;
wherein a respective first thin film transistor of the plurality of first thin film transistors comprises a first active layer, a first gate electrode, a first source electrode, and a first drain electrode; a respective second thin film transistor of the plurality of second thin film transistors comprises a second active layer, a second gate electrode, a second source electrode, and a second drain electrode;
the first active layer comprises a first semi-conductive channel part, a first conductive part electrically connected to the first drain electrode, and a second conductive part electrically connected to the first source electrode; the second active layer comprises a second semi-conductive channel part, a third conductive part electrically connected to the second source electrode, and a fourth conductive part electrically connected to the second drain electrode;
the array substrate further comprises an insulating layer between a respective capacitor electrode of the plurality of capacitor electrodes and first active layer, and an inter-layer dielectric layer between the respective capacitor electrode and the first drain electrode;
the second drain electrode is connected to the respective capacitor electrode of the plurality of capacitor electrodes through a first via extending through the inter-layer dielectric layer, the second drain electrode is connected to the first gate electrode through a second via extending through the inter-layer dielectric layer, and the respective capacitor electrode is insulated from the first active layer by the insulating layer;
the respective capacitor electrode, the insulating layer, and the first conductive part are configured to form a first storage capacitor;
the respective capacitor electrode, the first drain electrode, and the inter-layer dielectric layer are configured to form a second storage capacitor.

2. The array substrate of claim 1, wherein an orthographic projection of the first semi-conductive channel part on the base substrate at least partially overlaps with an orthographic projection of the first gate electrode on the base substrate; and
an orthographic projection of the respective capacitor electrode on the base substrate at least partially overlaps with an orthographic projection of the first conductive part on the base substrate.

3. The array substrate of claim 2, wherein the orthographic projection of the respective capacitor electrode on the base substrate substantially overlaps with the orthographic projection of the first conductive part.

4. The array substrate of claim 1, wherein the first conductive part has an area greater than an area of the second conductive part.

5. The array substrate of claim 1, wherein the insulating layer is a gate insulating layer between the first active layer and the first gate electrode, and between the respective capacitor electrode and the first conductive part.

6. The array substrate of claim 5, wherein the gate insulating layer has a thickness in a range of approximately 1500 Å to approximately 2000 Å.

7. The array substrate of claim 5, wherein the respective capacitor electrode and the first gate electrode are in a same layer.

8. The array substrate of claim 5, wherein the respective first thin film transistor is a top gate-type thin film transistor;
the gate insulating layer is on a side of the first active layer distal to the base substrate; and
the first gate electrode is on a side of the gate insulating layer distal to the first active layer.

9. The array substrate of claim 1,
wherein an orthographic projection of the respective capacitor electrode on the base substrate at least partially overlaps with an orthographic projection of the first conductive part on the base substrate, at least partially overlaps with an orthographic projection of the first drain electrode on the base substrate, and is non-overlapping with an orthographic projection of the second active layer on the base substrate.

10. The array substrate of claim 1, wherein the inter-layer dielectric layer is between a first conductive line layer and a second conductive line layer, the first conductive line layer comprising the first gate electrode and the second gate electrode, the second conductive line layer comprising the first source electrode, the first drain electrode, the second source electrode, and the second drain electrode;
the inter-layer dielectric layer has a thickness in a range of approximately 5000 Å to approximately 7000 Å.

11. The array substrate of claim 9, wherein an orthographic projection of the first drain electrode on the base substrate at least partially overlaps with an orthographic projection of the respective capacitor electrode on the base substrate.

12. The array substrate of claim 11, wherein the orthographic projection of the first drain electrode on the base substrate substantially overlaps with the orthographic projection of the respective capacitor electrode on the base substrate.

13. The array substrate of claim 1,
wherein an orthographic projection of the second drain electrode on the base substrate partially overlaps with an orthographic projection of the first conductive part on the base substrate.

14. The array substrate of claim 1, wherein the first active layer has an area greater than an area of the second active layer; and
the first active layer and the second active layer are insulated from each other.

15. The array substrate of claim 14, wherein the first active layer and the second active layer are in a same layer and spaced apart from each other.

16. The array substrate of claim 15, wherein the first active layer and the second active layer are in a same layer;
the first gate electrode, the second gate electrode, and the respective capacitor electrode are in a same layer; and
the first source electrode, the first drain electrode, the second source electrode, and the second drain electrode are in a same layer.

17. The array substrate of claim 1, further comprising a plurality of organic light emitting diodes;

wherein a respective light emitting diode of the plurality of organic light emitting diodes comprises a first electrode, a second electrode, and an organic light emitting layer between the first electrode and the second electrode; and the first electrode is electrically connected to the first drain electrode.

18. The array substrate of claim 1, wherein an orthographic projection of the respective capacitor electrode on the base substrate partially overlaps with an orthographic projection of the first drain electrode on the base substrate, and partially overlaps with an orthographic projection of the second drain electrode on the base substrate; and an orthographic projection of the first conductive part on the base substrate partially overlaps with an orthographic projection of the first drain electrode on the base substrate, and partially overlaps with an orthographic projection of the second drain electrode on the base substrate.

19. A display apparatus, comprising the array substrate of claim 1.

20. A method of fabricating an array substrate, comprising:

forming a plurality of first thin film transistors, a plurality of second thin film transistors, and a plurality of capacitor electrodes on a base substrate; and wherein forming a respective first thin film transistor of the plurality of first thin film transistors comprises forming a first active layer, forming a first gate electrode, forming a first source electrode, and forming a first drain electrode; forming a respective second thin film transistor of the plurality of second thin film transistors comprises forming a second active layer, forming a second gate electrode, forming a second source electrode, and forming a second drain electrode;

forming the first active layer comprises forming a first semi-conductive channel part, forming a first conductive part electrically connected to the first drain electrode, and forming a second conductive part electrically connected to the first source electrode; forming the second active layer comprises forming a second semi-conductive channel part, forming a third conductive part electrically connected to the second source electrode, and forming a fourth conductive part electrically connected to the second drain electrode;

the method further comprising forming an insulating layer and forming an inter-layer dielectric layer, the insulating layer being formed between a respective capacitor electrode of the plurality of capacitor electrodes and first active layer, and the inter-layer dielectric layer being formed between the respective capacitor electrode and the first drain electrode; forming a first via and a second via respectively extending through the inter-layer dielectric layer;

the second drain electrode is formed to be connected to the respective capacitor electrode of the plurality of capacitor electrodes through the first via, the second drain electrode is connected to the first gate electrode through the second via, and the respective capacitor electrode is insulated from the first active layer by the insulating layer;

the respective capacitor electrode, the insulating layer, and the first conductive part are configured to form a first storage capacitor;

the respective capacitor electrode, the first drain electrode, and the inter-layer dielectric layer are configured to form a second storage capacitor.

* * * * *